United States Patent [19]
Turner et al.

[11] Patent Number: 5,122,222
[45] Date of Patent: Jun. 16, 1992

[54] FREQUENCY-DOMAIN ANALYSIS OF RHEED DATA

[75] Inventors: George W. Turner, Chelmsford; Bettina A. Nechay, Northboro; Stephen J. Eglash, Concord, all of Mass.

[73] Assignee: Massachusetts Institute of Technology, Cambridge, Mass.

[21] Appl. No.: 582,755

[22] Filed: Sep. 14, 1990

[51] Int. Cl.$^5$ .............................................. C30B 25/16
[52] U.S. Cl. ..................... 156/601; 156/610; 156/612; 156/DIG. 102; 156/DIG. 103; 118/716; 118/719; 422/105; 437/105
[58] Field of Search ...... 156/601, 611, 610, DIG. 102, 156/DIG. 103; 118/716, 719; 422/105; 437/105

[56] References Cited

U.S. PATENT DOCUMENTS

| | | | |
|---|---|---|---|
| 4,508,590 | 4/1985 | Kaplan et al. | 156/611 |
| 4,636,268 | 1/1987 | Tsang | 156/611 |
| 4,806,321 | 2/1989 | Nishizawa et al. | 156/611 |
| 4,812,650 | 3/1989 | Eckstein et al. | 156/DIG. 103 |
| 4,855,013 | 8/1989 | Ohta et al. | 156/601 |
| 4,878,989 | 11/1989 | Purdes | 156/DIG. 103 |

OTHER PUBLICATIONS

"Multiple Reflection High-Energy Electron Diffraction Beam Intensity Measurement System", Resh et al., Rev. Sci. Instrum. 61(2), Feb. 1990, pp. 771-774.

Primary Examiner—Robert Kunemund
Attorney, Agent, or Firm—Hamilton, Brook, Smith & Reynolds

[57] ABSTRACT

Computerized acquisition and frequency-domain analysis of dynamic reflection high-energy electron diffraction (RHEED) intensity data is obtained during growth by molecular-beam epitaxy (MBE). Rapid, accurate determination of the frequency of RHEED oscillations can be obtained not only when these oscillations are well resolved, but also when the growth conditions yield oscillations that are too poorly resolved to permit frequency analysis by conventional procedures. The method has been used to study transients in the growth of AlGaAs on GaAs substrates and also to investigate the hetero-epitaxial growth of GaAs on Si.

20 Claims, 9 Drawing Sheets

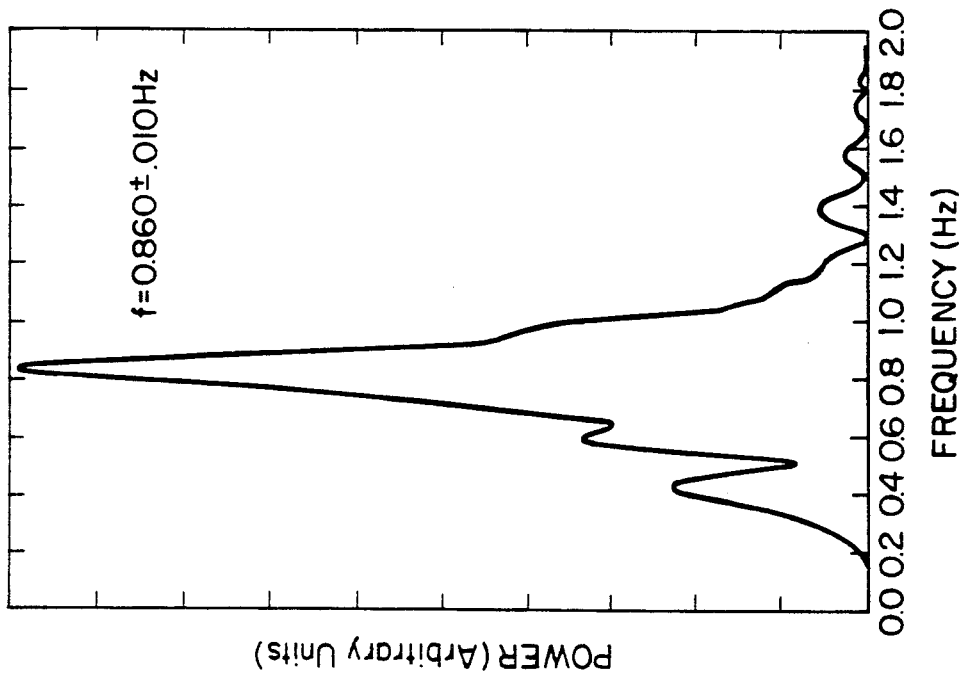
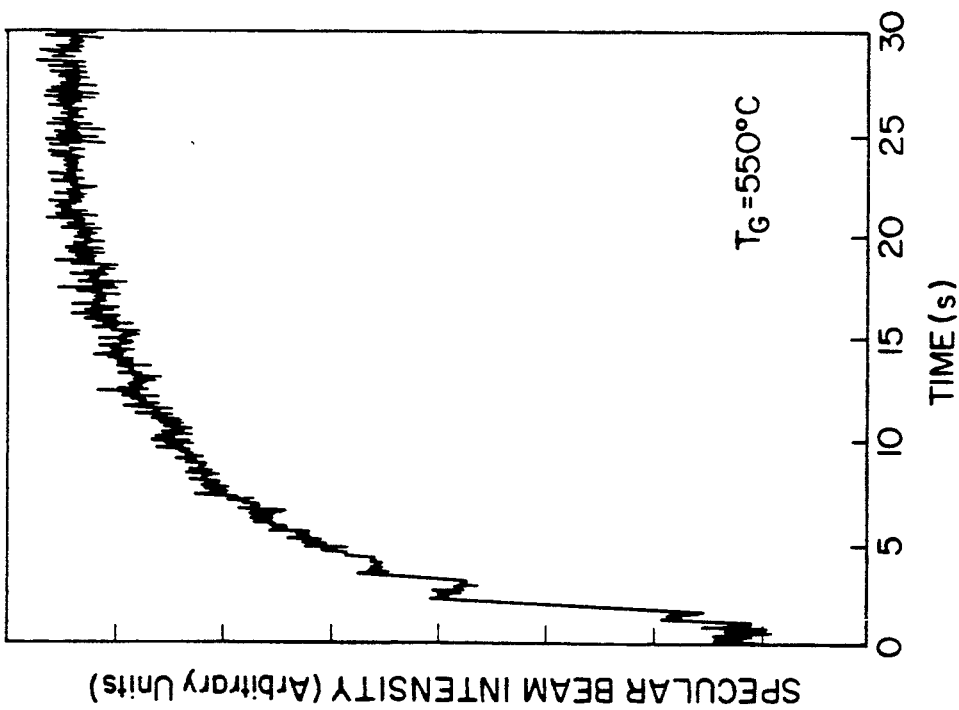

FREQUENCY-DOMAIN ANALYSIS OF RHEED DATA

GOVERNMENT SUPPORT

The Government has rights in this invention pursuant to Contract Number F19628-85-C-0002 awarded by the Department of the Air Force.

COPYRIGHT

Appendix A of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND ART

Measurement of film thickness during growth is required in a number of arts and especially in the growth of thin film semiconductors. Such films may comprise amorphous or polycrystalline or epitaxial films. Such films may be grown or deposited in a variety of reactors. One such reactor is a molecular beam epitaxy (MBE) reactor.

Recently, the examination of images formed by in situ reflection high-energy electron diffraction (RHEED) intensity data has become one of the most useful tools for the analysis of growth by MBE. Static RHEED images obtained when growth is interrupted, yield detailed information on surface reconstruction. Analysis of dynamic RHEED images ("RHEED oscillations"), plotted as a function of intensity versus time, and obtained as growth is taking place, can be employed to determine epitaxial growth rates and therefore alloy compositions. (See U.S. Pat. No. 4,855,013 issued Aug. 8, 1989.) This method is applicable because epitaxial growth causes a variation in surface roughness on the atomic scale that under favorable conditions produces well-resolved oscillations in the RHEED intensity whose period is the time required for the growth of one complete monolayer. Frequently, however, the conditions used for epitaxial growth yield oscillations that are not sufficiently obvious to permit the period to be obtained directly from plots of intensity versus time.

A need exists, therefore, for a method and apparatus which would permit analysis of RHEED or other oscillations under such unresolved growth conditions.

SUMMARY OF THE INVENTION

In accordance with the present invention, digital signal processing and frequency domain analysis is used to enable the a growth oscillation frequency to be extracted from data obtained under unresolved growth conditions, as well as from data exhibiting well-resolved oscillations. This system has the further advantage of allowing the frequency to be determined from even a single oscillation, so that it can be used for the investigation of growth transients. The system is described in connection with RHEED oscillations generated during MBE growth, but may find similar application in any growth system which exhibits detectable growth oscillations over time.

In accordance with the invention a layer of material being grown in a reactor is subjected to an energy beam. Oscillatory variations in the beam resulting from beam incidence on the growing material, are detected. The detected time varying pattern is converted to a frequency varying pattern to disclose pattern characteristics not readily observable in the time domain.

BRIEF DESCRIPTION OF THE DRAWINGS

FIG. 4 is a plot of RHEED intensity versus time for a GaAs-on-GaAs growth experiment which did not yield well-resolved oscillations.

FIG. 5 is a plot of the power spectrum for the experiment of FIG. 4.

DETAILED DESCRIPTION OF THE INVENTION

Figure 1:
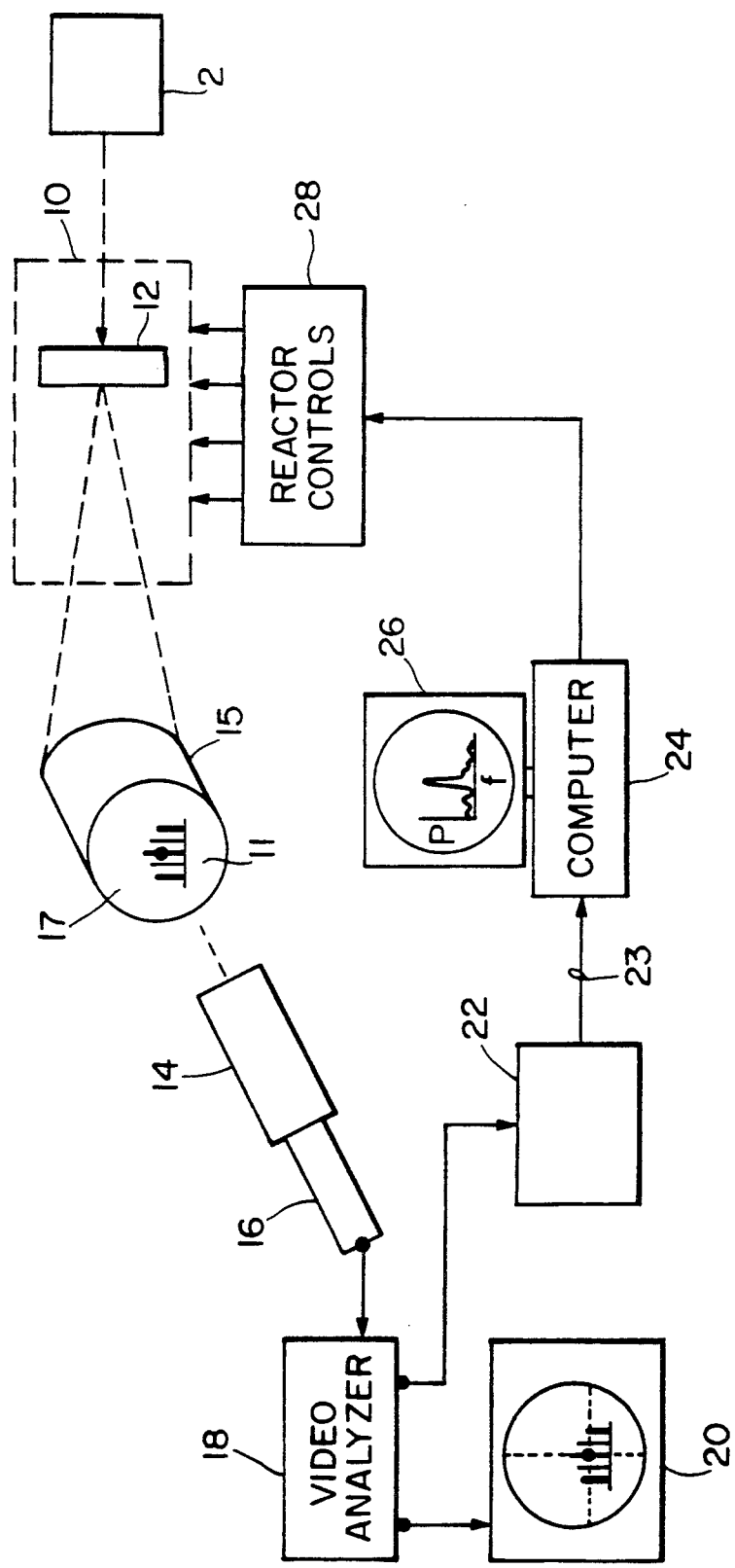
FIG. 1 is a schematic diagram of a measurement system in accordance with the invention.

The invention will now be described in detail in connection with the drawings. FIG. 1 is a schematic drawing of a preferred embodiment of the system of the invention, as illustrated by a RHEED measurement system, in accordance with the invention.

A Varian GEN II modular 3 in (MBE) reactor system 10 was used for the growth of GaAs, AlAs, and AlGaAs on GaAs substrates and the growth of GaAs on Si substrates. The GaAs substrates were prepared by chemical cleaning and etching followed by in situ oxide desorption at ~600° C. The Si substrates were prepared by chemical cleaning followed by an HF dip and in situ oxide desorption at 750°–850° C. The Ga source fluxes were adjusted to give GaAs growth rates between 0.8–1.1 $\mu$m/h, the Al fluxes were adjusted to give AlAs growth rates of 0.2–0.5 $\mu$m/h. and the V:III ratios were adjusted to give beam-equivalent pressure ratios of 5–10:1. The substrate temperatures during growth, which were monitored by thermocouple and optical pyrometer measurements (not shown), ranged from 500° to 620° C.

A RHEED image 11 was generated with a standard Varian RHEED electron gun 2 operated at 8 kV with an emission current of 2-3 A. The resultant image obtained on the phosphor screen 17 was captured with a CCD TV camera 16 equipped with a macro lens 14 that permits the magnification of any part of the image. The [110] azimuth of the As-stabilized 2×4 reconstructed GaAs (001) surface of wafer 12 in MBE chamber 10 for analysis and the lens 14 focused on the specularly reflected region of the diffracted image 11. The video signal from the CCD chamber 16 was connected to a Colorado Video Model 321 video analyzer 18. Analyzer 18 permits the selection of any pixel on the TV image 20 by the use of manually adjustable cross-hair controls. The voltage associated with the intensity of this pixel was read by a digital voltmeter and an X-Y recorder 22 with a time base. The digital voltmeter converted the measured voltage into digitized data at rates of 30-70 sample/s. The data were sent over an IEEE-488 bus 23 to an 80386-based desktop computer 24 equipped with a math co-processor and a commercial software package (National Instruments Lab Windows ®) for data collection and analysis. The software package provided a tool for developing a digital signal processing program (see Appendix A) to accomplish such tasks as base line correction to compensate for drift digital filtering to remove undesirable noise components, fast Fourier and fast Hartley transform analysis, and power spectrum measurements.

The following procedure was generally employed in obtaining the RHEED oscillation data for growth on GaAs substrates. A GaAs layer about 0.5- μm thick was first grown under conventional conditions. Growth was then interrupted momentarily by manually closing the Ga source shutter while keeping the As shutter open to maintain an As stabilized surface.

After about 30 s, a pixel was selected on the specularly reflected streak, and collection of intensity data was initiated. Growth was resumed by reopening the Ga shutter, continued for a predetermined interval, and again interrupted by closing the Ga shutter while keeping the As shutter open. Data collection was automatically terminated at some later time. Usually, 2048 data samples were collected over an interval of about 30 s. The RHEED oscillation frequency was then found by the computer analysis program. The computation utilizes an accurate value for the voltmeter sampling rate, which is determined from the number of samples and the total data collection time measured by using the internal clock of the computer. For GaAs growth on Si substrates the same procedure was followed after about 1 μm of GaAs had been deposited.

To a first order the RHEED oscillation signal consists of periodic (sinusoidal) and nonperiodic (damped) components. Therefore, one can estimate the limiting precision of determining the exact oscillation frequency. First, since the periodic signals of interest have a frequency of ~1 Hz and the sampling rate is ~70 Hz, the system is "over-sampling" and not limited by Nyquist considerations. Second, since data is taken over 30-s intervals repeated (albeit damped) oscillations of the periodic signal are sampled. In the frequency domain, the spacing between points is therefore given by $\Delta f(Hz) = 1/NT$, where N-number of samples and T=sampling interval in the time domain.

In this work, N=2048 and T=14.3 ms yielding $\Delta f = 0.0342$ Hz. Without further analysis, this value yields a maximum frequency uncertainty of $\pm \Delta f/2 = 0.0171$ Hz. By using a simple algorithm (described later) for determining the centroid of the peak of the power spectrum, a minimum frequency uncertainty of less than 0.003 Hz is attained which has been confirmed by repeated measurements during growth on the same high-quality GaAs substrate. The frequency uncertainty can be reduced still further by taking more samples, increasing the sampling rate, or using more sophisticated algorithms for centroid location.

Figure 2:
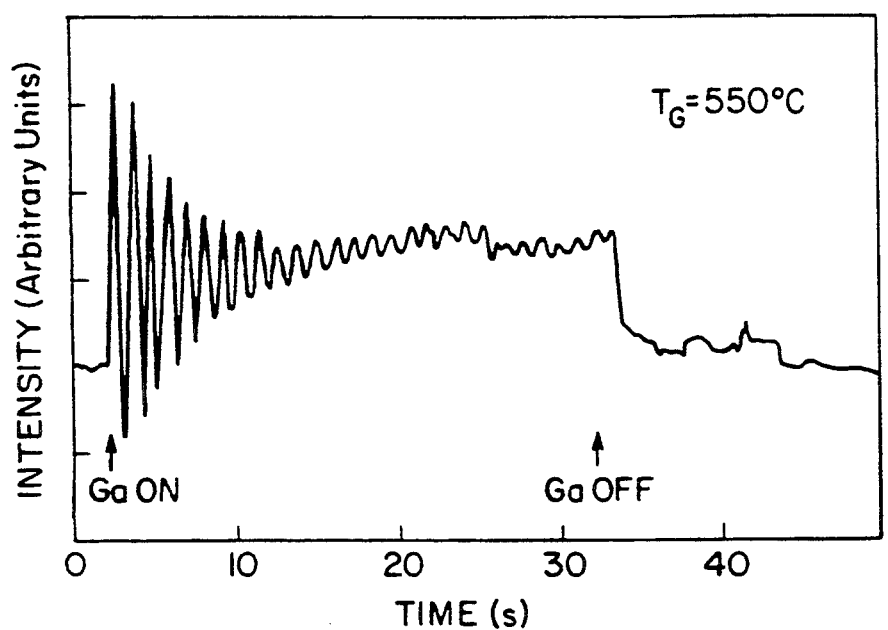
FIG. 2 is a plot of RHEED intensity versus time for a GaAs on GaAs MBE growth experiment using prior art techniques.
Figure 3:
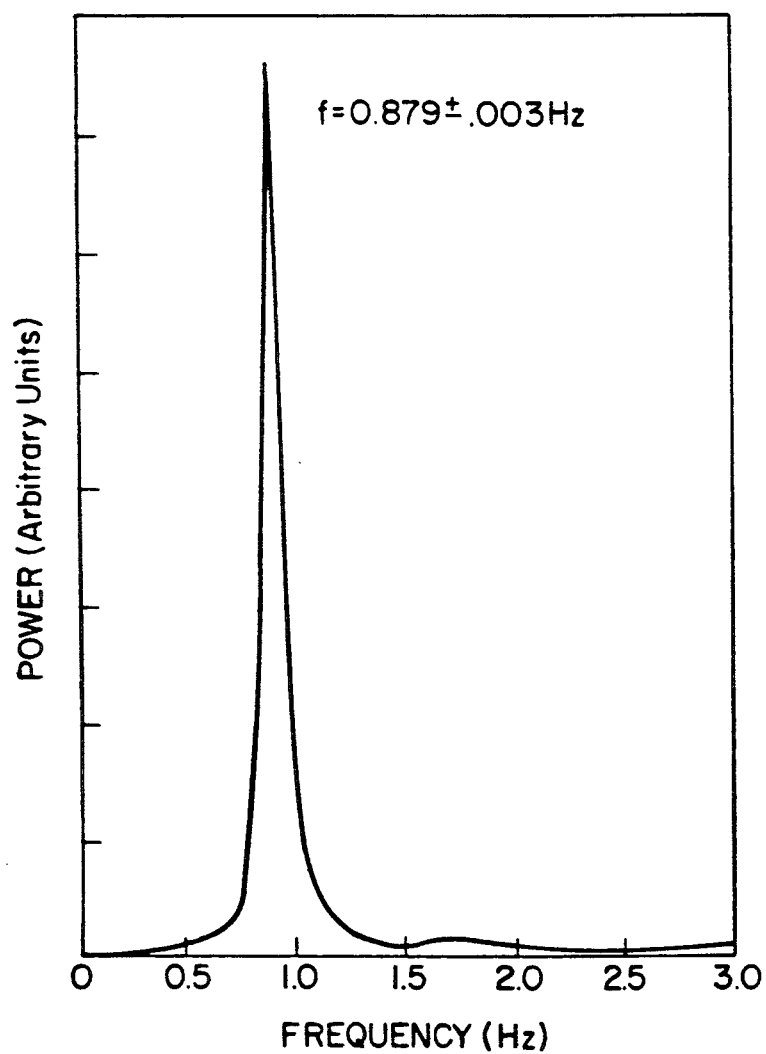
FIG. 3 is a plot of the power spectrum, i.e., power versus frequency of the RHEED data for the same experiment using the method and and apparatus of the invention.

FIG. 2 is a recorder trace of intensity versus time that was obtained for a run in which GaAs was grown on a high-quality GaAs substate at ~500° C. under conditions that were optimized for obtaining well-resolved RHEED oscillations. (The signal plotted is not linearly related to the pixel intensity, since the video analyzer output was inverted and offset by a dc bias supplied by the recorder.) Opening the Ga shutter produces an abrupt change in intensity, which is followed by a large number of distinct oscillations that decay in amplitude with time. When the Ga shutter is closed, the intensity again changes rapidly to approximately the initial value, and no further oscillations are observed. The average frequency determined from the time required for the first 17 oscillations is 0.872 Hz, which corresponds to a growth rate of 0.887 μm/h, since the height of a (100) GaAs monolayer is half the lattice constant ($a_o = 0.565\ 33$ nm). FIG. 3 shows the power spectrum obtained for the same experiment by using the new measurement method with contains a clearly resolved peak at 0.879 Hz, corresponding to a growth rate of 0.894 μm/h, which agrees with the value obtained from the recorder trace.

FIG. 4 is a recorder trace obtained on another day for GaAs growth under conditions similar to those for the experiments of FIGS. 2 and 3, but on a GaAs substrate of inferior quality. In this case, the oscillations are so weak and indistinct that the frequency cannot be accurately determined by inspection of the trace. However, by applying the new analysis method which performed a base line correction to compensate for the long-term nonperiodic variation in the signal, the RHEED oscillation frequency can be obtained. The power spectrum obtained, which is shown in FIG. 5, contains a dominant peak at 0,860 Hz, corresponding to a growth rate of 0.875 μm/h. The excellent agreement between this value and the growth rate determined from FIG. 3 is further evidence for the validity of the new method, since the growth rate of GaAs under the conditions employed in the two experiments is primarily determined by the Ga flux, which was nominally the same.

Figure 6:
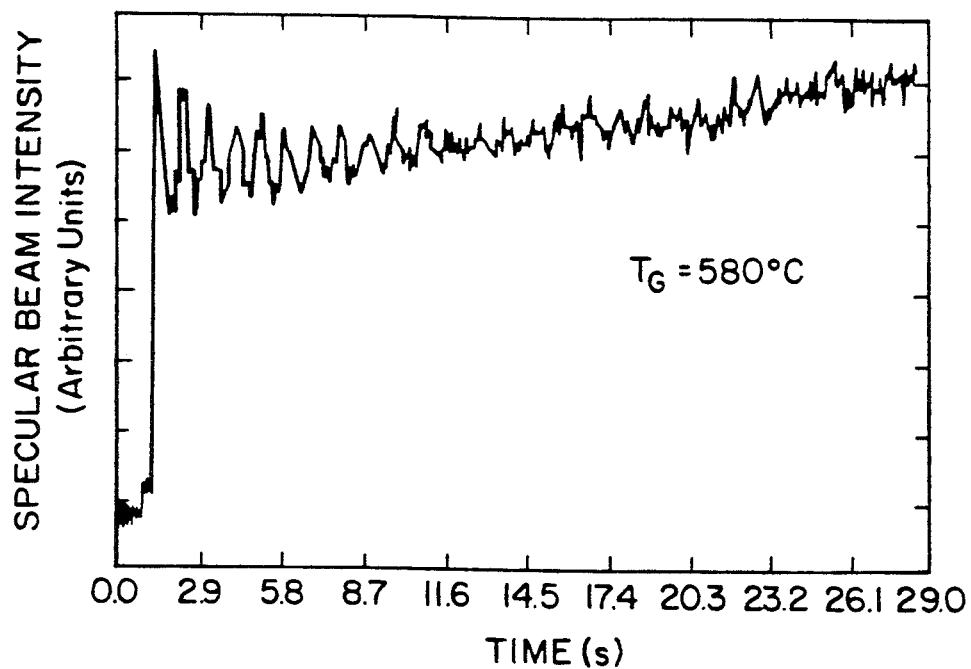
FIG. 6 is a plot of RHEED intensity versus time for a GaAs-on-GaAs growth experiment showing quickly damped oscillations.
Figure 7:
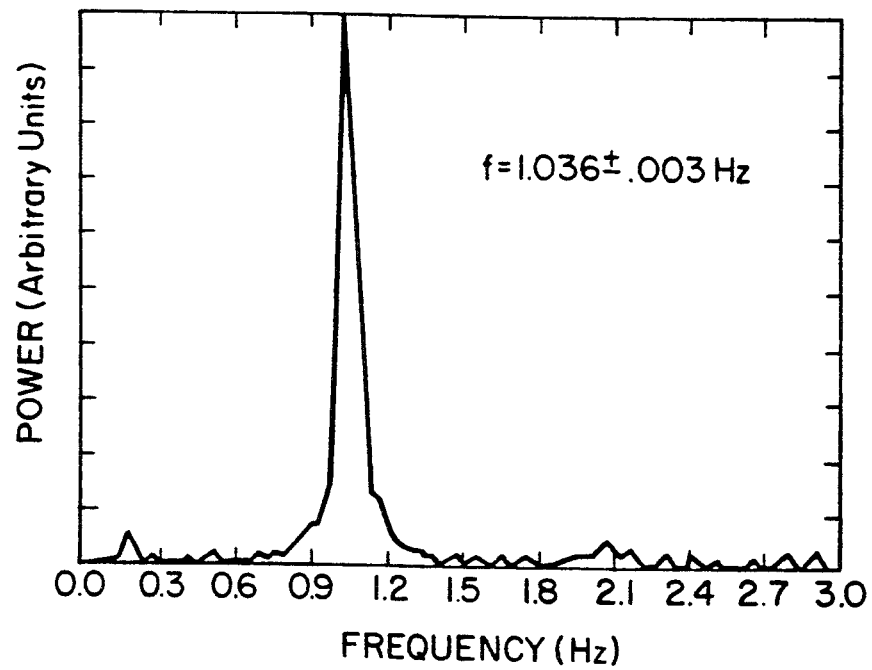
FIG. 7 is a plot of the power spectrum for the experiment of FIG. 6.
Figure 8:
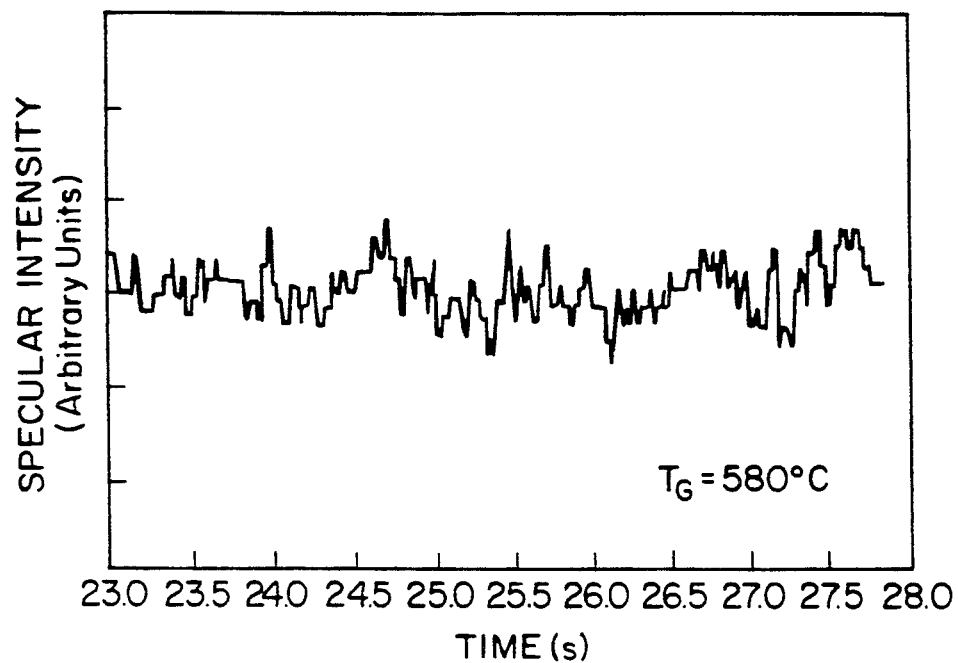
FIG. 8 is a plot of RHEED intensity versus time for the last five seconds of the experiment of FIG. 6.
Figure 9:
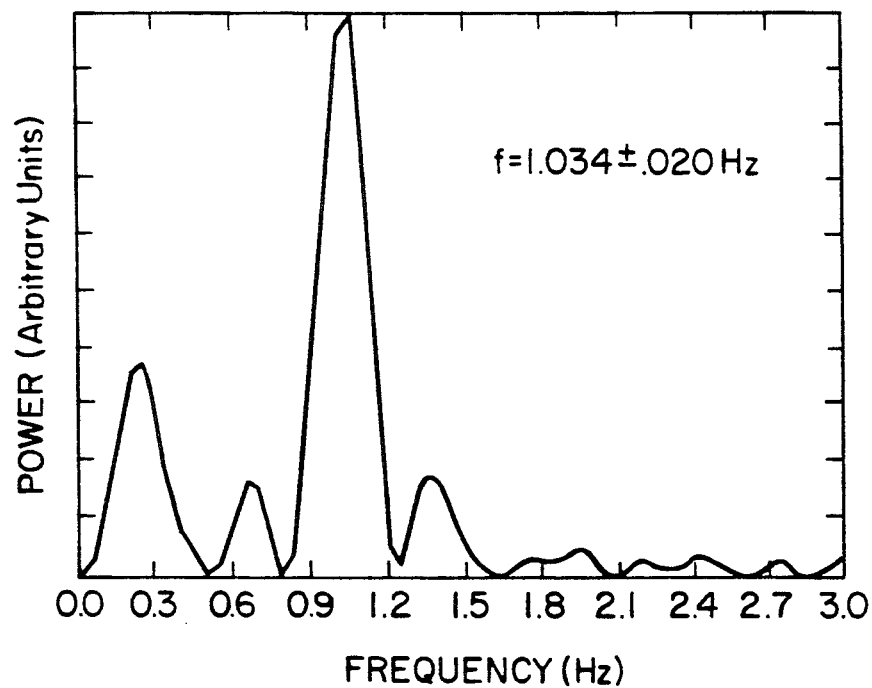
FIG. 9 is a plot of the power spectrum for the data of FIG. 8.

To further demonstrate the power of the new frequency measurement system, a growth experiment was performed with the GaAs substrate temperature raised to ~580° C. As shown by the plot of FIG. 6, this procedure resulted in a series of rapidly damped RHEED oscillations. Computer analysis of all the intensity data yielded the power spectrum shown in FIG. 7, which has a peak at 1.036 Hz. FIG. 8 is a plot of intensity vs time on an expanded scale for the last 5 s of the experiment. The data are so noisy that no oscillations can be observed. However, the computer analysis yielded the power spectrum shown in FIG. 9, which has a predominant peak at 1.034 Hz, almost exactly the value obtained for the experiment as a whole.

Figure 10:
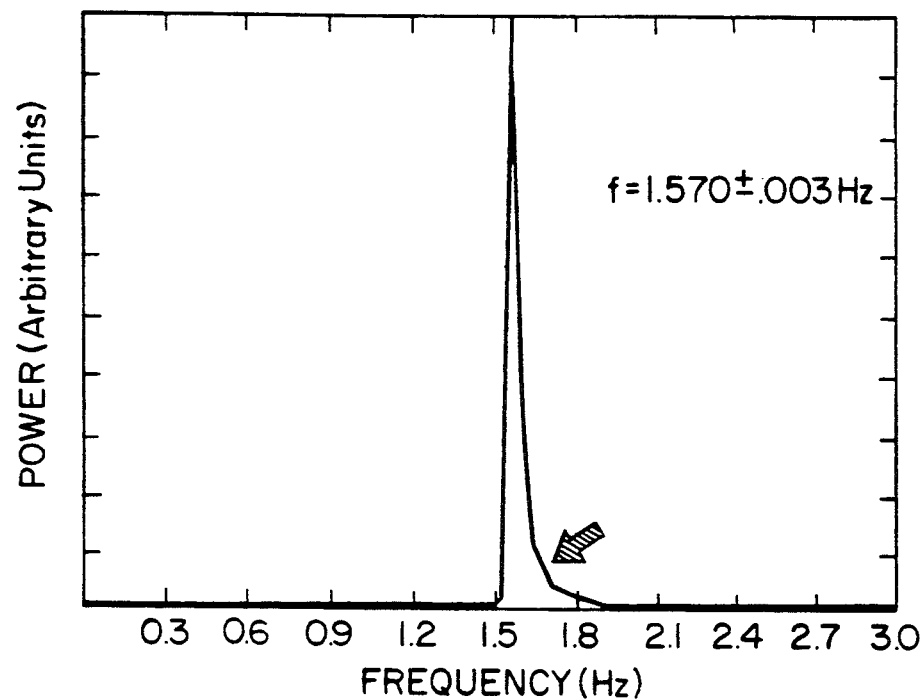
FIG. 10 is a plot of the power spectrum for a GaAlAs.-on-GaAs growth experiment.
Figure 11:
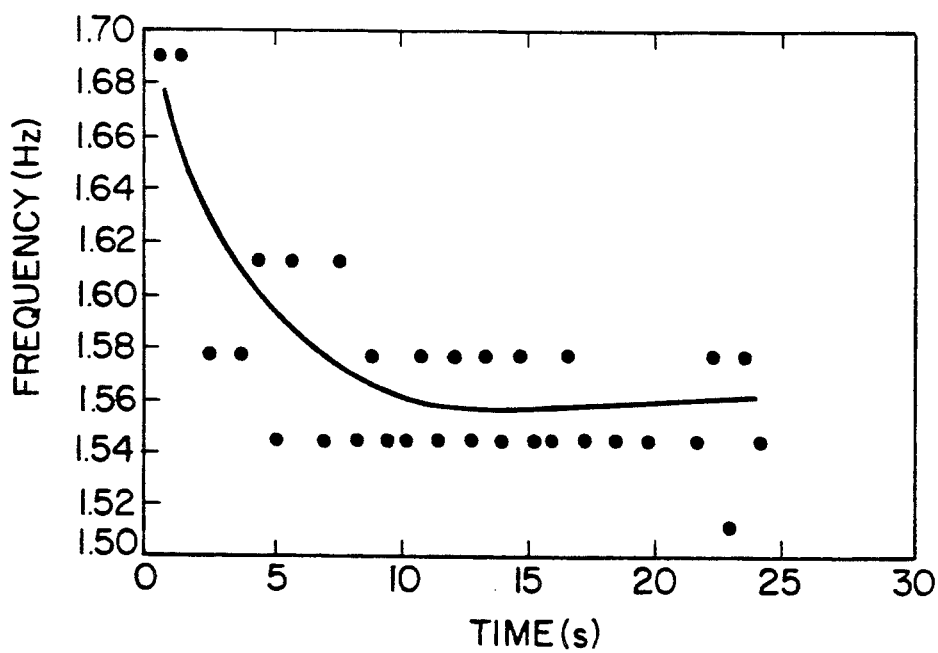
FIG. 11 is a cycle-by-cycle plot of RHEED frequency for the experiment of FIG. 10.

In some power spectra the frequency peak is strongly asymmetric, as shown in FIG. 10, for an experiment on the growth of GaAlAs. The asymmetry appears to be due to flux transients in the Ga and Al sources. Since the computer analysis can be performed on a single oscillation (although the accuracy is significantly reduced because the number of samples taken per cycle is relatively small), a cycle-by-cycle analysis was carried out for the experiment of FIG. 10. As shown in FIG. 11, the frequency is initially about 1.70 Hz, but quickly stabilizes at about 1.56 Hz.

Figure 12:
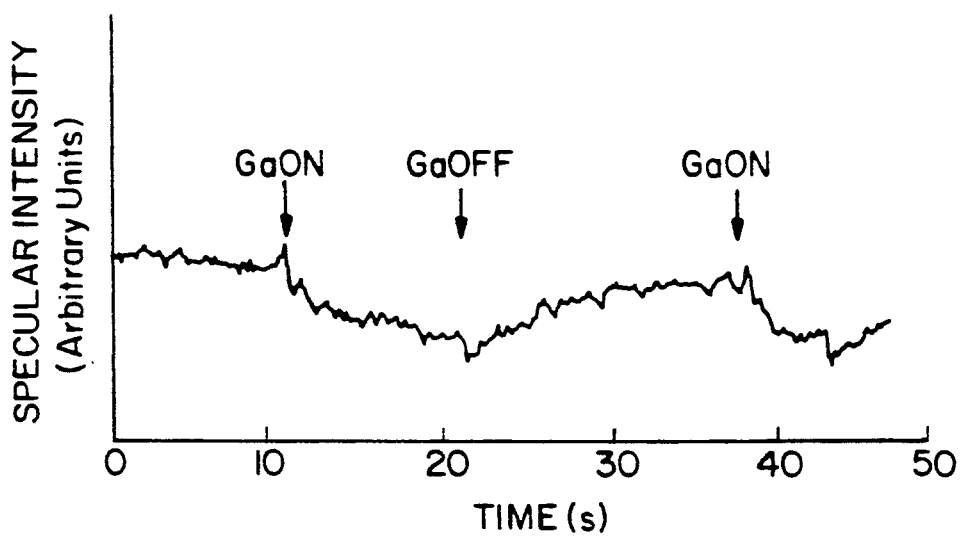
FIG. 12 is a plot of RHEED intensity versus time for a GaAs-on-Si experiment.
Figure 13:
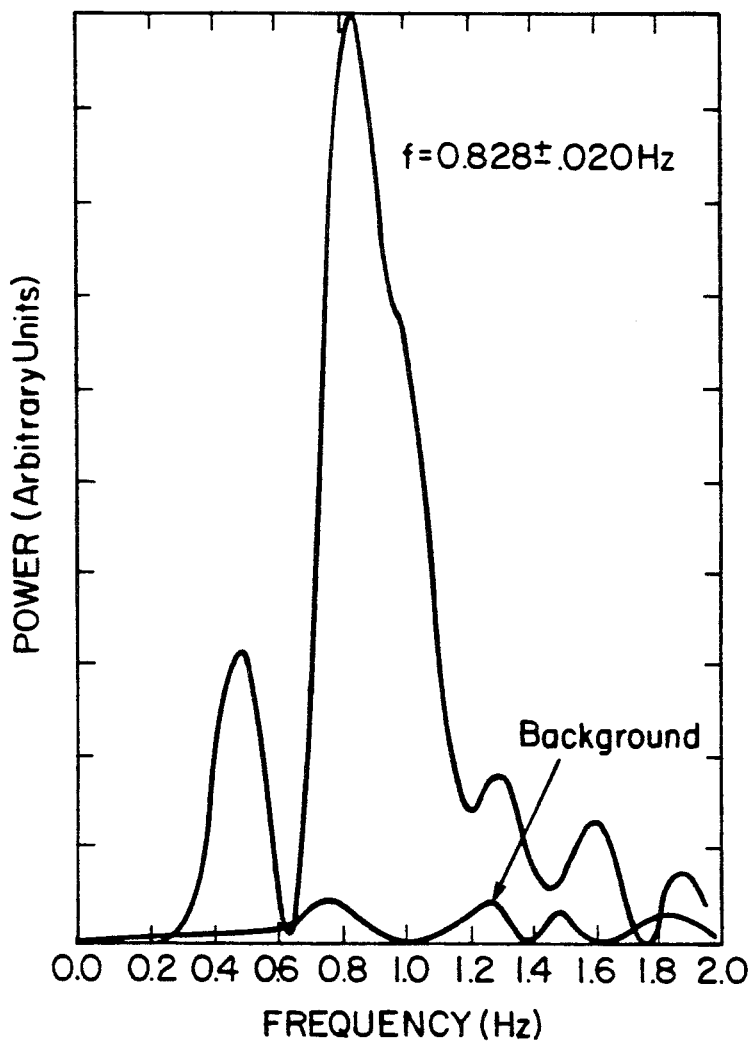
FIG. 13 is a power spectrum for the experiment of FIG. 12.
Figure 14:
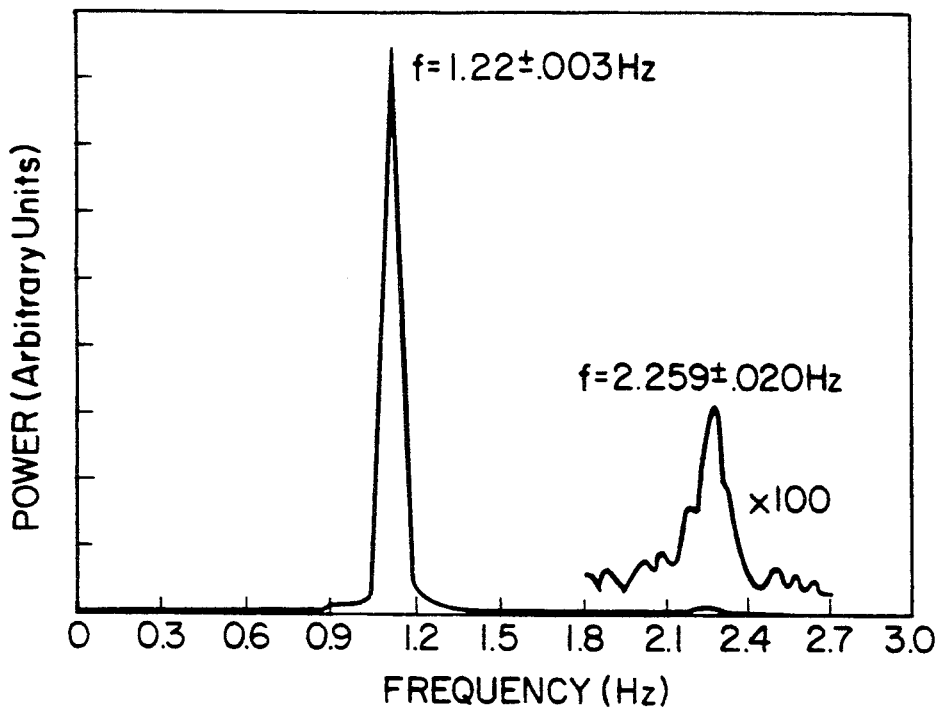
FIG. 14 is a power spectrum for a GaAs-on-GaAs growth experiment.

The frequency-domain analysis has also been applied in experiments on GaAs-on-Si growth. FIG. 12 is an intensity vs time plot obtained in one such experiment. Although the effect of opening and closing the Ga shutter is apparent, the diffraction is weak, and oscillations cannot be clearly resolved. However, computer analysis yields the power spectrum shown in FIG. 13, which has a predominant peak at 0.828 Hz, in good agreement with the growth rate determined by sample thickness measurements. We are presently using the frequency analysis technique to investigate the initial stages of GaAs-on-Si heteroepitaxy, where the growth is more three-dimensional in nature Finally, an interesting feature that is present in a number of power spectra is illustrated in FIG. 14. In addition to the main peak at frequency f, there is also a resolvable peak at 2f, although a second harmonic is not apparent in the intensity vs time data. Initially, we thought that such additional peaks at 2f might be the result of some nonlinearity in the response of our system. However, even the intentional introduction of nonlinear response by clipping the data at a fixed amplitude did not produce 2f peaks of the magnitude shown in FIG. 14. Others have directly observed harmonic components in intensity-time RHEED data taken at different azimuthal angles. Perhaps similar harmonics are being resolved by our measurement technique even though they are too weak to be seen in the time-domain data.

Referring now to Appendix A and FIGS. 15 and 16, the details of the signal processing method to convert the time domain data, obtained from the digital voltmeter of unit 22 (FIG. 1), the frequency domain data will now be described. A primary function of the computer program of Appendix A is to obtain RHEED oscillation frequency data from a digitized signal stored or read directly from the voltmeter of unit 22 as the growth process is proceeding in reactor 10. This data can then be utilized by computer 24 to feedback control signals to reactor controls 28 to change growth patterns to optimize the desired growth in reactor 10.

Figure 15:
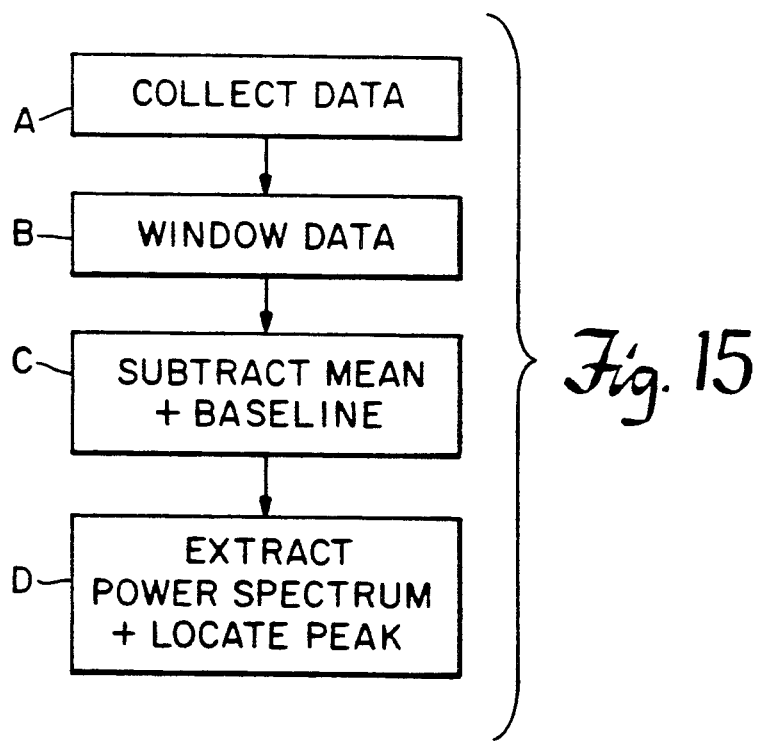
FIG. 15$a$–$d$ are method diagrams of the steps of converting collected time domain data to frequency domain data.
Figure 16:
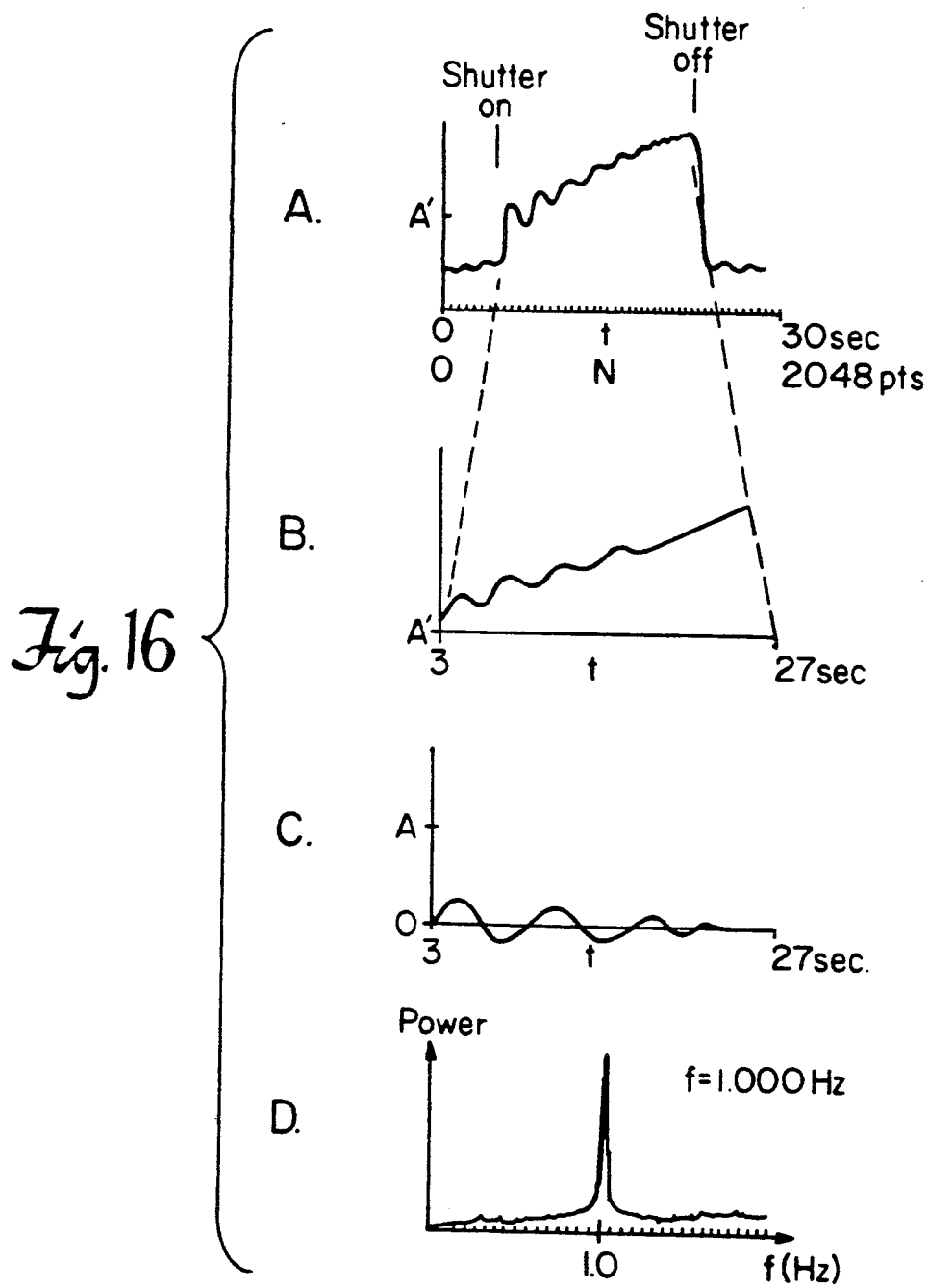
FIG. 16$a$–$d$ are a series of plots of the wave shape of the collected data resulting from the steps of FIG. 15.

In the first main routine of the process, the computer is programmed to collect and display the input voltage versus time RHEED oscillation data (FIG. 15, Step A). This routine generally extends from item of Appendix A, to item II page 6. In the Display Mode (item III), the collected data and/or processed data is displayed on the screen 26. Furthermore, only certain data may be selected for display using the window sub-routine "zero data" described at Appendix A at VI, and shown at FIG. 16A.

The windowed data is then processed to determine the mean of the voltage versus time data curve using the sub-routine "meandata" which begins at item IV. Next, the baseline trend of the curve is calculated by fitting a fifth order polynomial to the data and the baseline trend is subtracted from the data (see item V continuing through item VIII, "Poly Fit" sub-routine and FIGS. 15C and 16C). The data is now ready for signal processing to determine the power spectrum, i.e., the power versus frequency curve of the pixel under inspection (see FIGS. 15D and 16D). The sub routines for power spectrum extraction are the "fht data" routine and "ps data". The "fht data" routine is described (item VII) wherein the fast Hartley transform of the data is displayed and optional data filtering is performed. The sub routine "ps data" starts at item IX and comprises calculation of the power spectrum of the data and finding the peak frequency using a centroid finding algorithm.

In summary, a computerized system for the frequency-domain analysis of time-dependent RHEED intensity data has been described. In addition to the rapid, accurate analysis of well-resolved RHEED oscillations, this method permits the extraction of oscillation frequencies from data, like those obtained for GaAs-on-Si growth, that cannot be analyzed by conventional time domain methods. The additional information that can be provided by the new technique on the more subtle features of RHEED oscillations may contribute to improved understanding of the nature of epitaxial growth.

Equivalents

Those skilled in the art will know, or be able to ascertain using no more than routine experimentation, many equivalents to the specific embodiments of the invention described herein.

While the invention has been described in connection with RHEED oscillations, other applications are envisioned for this system. For example, any in situ method for generating an incident beam on a specimen during growth and detecting the resultant beam variations with time will benefit from the invention. Thus, light scattering, rather than diffraction phenomena, may be detected and used as the time domain data for determining growth oscillation Photo-emissions or reflected beams may also generate detectable oscillations The beam may comprise any suitable energy beam, such as an electron beam, photon beam, ion beam or X-ray beam.

All manner of growth chambers, including (PVD) or the like, are contemplated, as well as a wide variety of growth materials, such as superconductors, silicides and metal organic films of semiconductors material, without limitation.

These and all other equivalents are intended to be encompassed by the following claims.

MIT-5331L

APPENDIX A

```
'RHEED.BAS - August 1990   B.A. Nechay (Initial code written June 1989)
'This program derives RHEED oscillation frequency from a digitized signal
' stored in an input file or from data read directly from a HP digital
' multimeter. It also uses signal processing techniques such as Butterworth
' Low and High Pass Filtering, baseline subtraction using fifth order
```

Copyright Massachusetts Institute of Technology 1990

```
' polynomial fitting, running averages of signal, and mean subtraction. The
' maximum sampling frequency, dictated by the speed of the HP multimeter,
' is about 70Hz.
'
'NOTE: This file can only run in an executable version since the LW
' interactive environment only supports a limited number of QBasic commands
' and since the program plus supporting LW libraries are too large to load
' into the QBasic interactive environment.
' To compile this program in the C:\QB45 directory, the bc/e/x/d command
' must be used (/e/x to make use of error correction, and /d to allow
' Cntrl+Break to stop the program). The object file must then be linked
' with the Graphics, GPIB, and Analysis libraries.
'---------------------------------------------------------------------------
'Declare all functions via the RHEED.INC file and DECLARE statements.
'The RHEED.INC file contains LabWindows function declarations extracted
' from various LabWindows .INC files in the c:\lw\include directory. It
' must reside in that directory during compilation.
REM     $INCLUDE: 'C:\LW\INCLUDE\RHEED.INC'
DECLARE SUB meandata (freq AS SINGLE, num AS INTEGER, Filename AS STRING)
DECLARE SUB zerodata (freq AS SINGLE, num AS INTEGER, Filename AS STRING)
DECLARE SUB signave (freq AS SINGLE, num AS INTEGER, Filename AS STRING)
DECLARE SUB display (freq AS SINGLE, num AS INTEGER, Filename AS STRING)
DECLARE SUB fhtdata (freq AS SINGLE, num AS INTEGER, Filename AS STRING)
DECLARE SUB psdata (freq AS SINGLE, num AS INTEGER, Filename AS STRING)
DECLARE SUB basesubtr (freq AS SINGLE, num AS INTEGER, Filename AS STRING)
DECLARE SUB freqvst (freq AS SINGLE, num AS INTEGER, Filename AS STRING)
DECLARE SUB getfreq (freq AS SINGLE, num AS INTEGER, Filename AS STRING)
'Make all arrays dynamic (array memory allocated during execution of program)
REM     $DYNAMIC 'Dimension variables and arrays
DIM SHARED O AS STRING * 1 'Used when inputing user options
DIM SHARED FO AS STRING * 1 'Used only to query user to overwrite a file
DIM SHARED Filename AS STRING*8 'Holds the input or output filename
DIM SHARED vstr AS STRING*13 'Used to read a string of data from the HP meter
DIM SHARED lstring AS STRING * 60 'A line of text stored in a RHEED data file
DIM SHARED lstring1 AS STRING 'The first line of text in a RHEED file
DIM SHARED lstring2 AS STRING 'The second line of text in a RHEED file
DIM SHARED fstring AS STRING'Used to extract sampling freq from line 1 of file
REDIM SHARED volt(2200) AS SINGLE 'Holds the signal voltage array
REDIM SHARED x(2200) AS DOUBLE 'Array of x values used mostly when plotting
REDIM SHARED darray(2200) AS DOUBLE'A working array used mostly in LW routines
REDIM SHARED fr(75) AS DOUBLE 'An array of freq values used in GETFREQ
REDIM SHARED minindex(75) AS INTEGER 'An array used in the GETFREQ routine
REDIM SHARED coeff(10) AS DOUBLE 'An array holding polynomial fit coefficients
DIM SHARED freq AS SINGLE 'Sampling frequency
DIM SHARED num AS INTEGER 'Number of data points in the current file
'Many other local variables exist which are not described above 'Set up error handling , define constants, get 40000 bytes of RAM memory
' as work area for LabWindows routines, and set up the printer
ON ERROR GOTO ErrHandling
CONST RIGHT.ARROW% = 77, LEFT.ARROW% = 75, F1% = 59, F2% = 60, F10% = 68
CONST HOME% = 71, ENDKEY% = 79, PGUP% = 73, PGDN% = 81
CALL getmem(40000&)
CALL SetupPrinter ("LPT1", 1, 8.0, 10.0, 0) 'Assume our printer is LPT1
vstr$=""
'RHEED.BAS - August 1990   B.A. Nechay (Initial code written June 1989)
'This program derives RHEED oscillation frequency from a digitized signal
' stored in an input file or from data read directly from a HP digital
' multimeter. It also uses signal processing techniques such as Butterworth
' Low and High Pass Filtering, baseline subtraction using fifth order
' polynomial fitting, running averages of signal, and mean subtraction. The
' maximum sampling frequency, dictated by the speed of the HP multimeter,
' is about 70Hz.
'
'NOTE: This file can only run in an executable version since the LW
' interactive environment only supports a limited number of QBasic commands
' and since the program plus supporting LW libraries are too large to load
' into the QBasic interactive environment.
```

```
' To compile this program in the C:\QB45 directory, the bc/e/x/d command
' must be used (/e/x to make use of error correction, and /d to allow
' Cntrl+Break to stop the program). The object file must then be linked
' with the Graphics, GPIB, and Analysis libraries.
'-------------------------------------------------------------------
'Declare all functions via the RHEED.INC file and DECLARE statements.
'The RHEED.INC file contains LabWindows function declarations extracted
' from various LabWindows .INC files in the c:\lw\include directory. It
' must reside in that directory during compilation.
REM     $INCLUDE: 'C:\LW\INCLUDE\RHEED.INC'
DECLARE SUB meandata (freq AS SINGLE, num AS INTEGER, Filename AS STRING)
DECLARE SUB zerodata (freq AS SINGLE, num AS INTEGER, Filename AS STRING)
DECLARE SUB signave (freq AS SINGLE, num AS INTEGER, Filename AS STRING)
DECLARE SUB display (freq AS SINGLE, num AS INTEGER, Filename AS STRING)
DECLARE SUB fhtdata (freq AS SINGLE, num AS INTEGER, Filename AS STRING)
DECLARE SUB psdata (freq AS SINGLE, num AS INTEGER, Filename AS STRING)
DECLARE SUB basesubtr (freq AS SINGLE, num AS INTEGER, Filename AS STRING)
DECLARE SUB freqvst (freq AS SINGLE, num AS INTEGER, Filename AS STRING)
DECLARE SUB getfreq (freq AS SINGLE, num AS INTEGER, Filename AS STRING)
'Make all arrays dynamic (array memory allocated during execution of program)
REM     $DYNAMIC 'Dimension variables and arrays
DIM SHARED O AS STRING * 1 'Used when inputing user options
DIM SHARED FO AS STRING * 1 'Used only to query user to overwrite a file
DIM SHARED Filename AS STRING*8 'Holds the input or output filename
DIM SHARED vstr AS STRING*13 'Used to read a string of data from the HP meter
DIM SHARED lstring AS STRING * 60 'A line of text stored in a RHEED data file
DIM SHARED lstring1 AS STRING 'The first line of text in a RHEED file
DIM SHARED lstring2 AS STRING 'The second line of text in a RHEED file
DIM SHARED fstring AS STRING'Used to extract sampling freq from line 1 of file
REDIM SHARED volt(2200) AS SINGLE 'Holds the signal voltage array
REDIM SHARED x(2200) AS DOUBLE 'Array of x values used mostly when plotting
REDIM SHARED darray(2200) AS DOUBLE'A working array used mostly in LW routines
REDIM SHARED fr(75) AS DOUBLE 'An array of freq values used in GETFREQ
REDIM SHARED minindex(75) AS INTEGER 'An array used in the GETFREQ routine
REDIM SHARED coeff(10) AS DOUBLE 'An array holding polynomial fit coefficients
DIM SHARED freq AS SINGLE 'Sampling frequency
DIM SHARED num AS INTEGER 'Number of data points in the current file
'Many other local variables exist which are not described above 'Set up error handling , define constants, get 40000 bytes of RAM memory
' as work area for LabWindows routines, and set up the printer
ON ERROR GOTO ErrHandling
CONST RIGHT.ARROW% = 77, LEFT.ARROW% = 75, F1% = 59, F2% = 60, F10% = 68
CONST HOME% = 71, ENDKEY% = 79, PGUP% = 73, PGDN% = 81
CALL getmem(40000&)
CALL SetupPrinter ("LPT1", 1, 8.0, 10.0, 0) 'Assume our printer is LPT1
vstr$=""
'Start of New Data section
START:
Errflag% = 0 'Assume 0 data gathering errors at start
CLS
'Choose option : get new data from Voltmeter, File or Exit
INPUT "Get new data from Digital Voltmeter (V), from file (F) or exit (E) : ",
O$ = UCASE$(O$) 'Not case sensitive
IF (O$ <> "V") AND (O$ <> "F") AND (O$ <> "E") THEN GOTO START
IF (O$ = "E") THEN 'Exit on 'E' option
    CLS
    GOTO ENDL
END IF
'If File option was chosen
IF (O$ = "F") THEN
    CALL Clear1D (darray#(), 2200)
    FOR i% = 0 TO 2200: volt!(i%) = 0!: NEXT i%
    SHELL "DIR/W .DAT"
    PRINT
ASKFN1: INPUT "Input Filename (????????.DAT) or '%' to escape: ", Filename$
    Errflag% = 0
    IF Filename$ = "          " THEN GOTO ASKFN1
```

```
    IF LTRIM$(RTRIM$(Filename$))="%" THEN GOTO START
    OPEN Filename$ + ".DAT" FOR INPUT AS #1
    IF Errflag% = 1 THEN GOTO ASKFN1
    INPUT #1, lstring1
    INPUT #1, lstring2
    IF Errflag% = 1 THEN 'If error occured on input
        BEEP
        PRINT
        PRINT "ERROR: Input Past End of File ... Try again ..."
        Start# = TIMER: WHILE TIMER < Start# + 1 : WEND 'Wait 1 sec
        CLOSE #1
        GOTO START
    END IF
    PRINT
    PRINT "----------------------------------------------------------"
    PRINT "COMMENT LINES: "
    PRINT lstring1
    PRINT lstring2
    PRINT "----------------------------------------------------------"
    Start# = TIMER: WHILE TIMER < Start# + .5 : WEND 'Wait .5 sec
    PRINT
    'Get sampling frequency from first line of file
    f% = INSTR(lstring1$, "=")
    IF (f% > 0) THEN
        fstring$ = MID$(lstring1$, (f% + 1))
        freq! = VAL(fstring$)
    ELSE 'If no sampling frequency was stored, then enter one ...
ASKF:   INPUT "Enter sampling frequency or RETURN to escape : ", freq!
        IF freq! = 0! THEN
            CLOSE #1
            GOTO START
        END IF
        IF freq! < 0! THEN GOTO ASKF
    END IF
    PRINT "Reading data from file - please wait ..."
    num% = 0
    FOR i% = 0 TO 2200: volt!(i%) = 0!: NEXT i%
    WHILE (EOF(1) > -1) AND num% < 2200
        INPUT #1, V!
        IF Errflag% = 1 THEN 'If error occured on input (probably would only
            BEEP             '  happen on the first input statement)
            PRINT
            PRINT "ERROR: Input Past End of File ... Try again ..."
            Start# = TIMER: WHILE TIMER < Start# + 1 : WEND 'Wait 1 sec
            CLOSE #1
            GOTO START
        END IF
        IF V! < 1000! THEN
            volt!(num%) = V!
            x#(num%) = num% / freq!
            num% = num% + 1
        END IF
    WEND
    IF num% = 0 THEN
        PRINT "ERROR: No Data Read"
        GOTO ENDL
    END IF
ELSE
VMDATA: CALL Clear1D (darray#(), 2200)
    FOR i% = 0 TO 2200: volt!(i%) = 0!: NEXT i%
ASKSR: CLS
ASKST: PRINT "Enter sampling time in seconds : "
    INPUT "    Enter (Default 0.1s, Fastest about 0.015s) : ",St#
    IF St#<0 THEN GOTO ASKST
    IF St# = 0 THEN St# = 0.1# 'Default 0.1s for the sampling time
ASKFN2: INPUT "Output Filename (????????.DAT) or '%' to escape : ", Filename$
    IF Filename$ = "          " THEN GOTO ASKFN2
    'Check if the file already exists and whether or not to overwrite it
```

```
FileExists% = 1 'Initially assume that the file already exists
OutFile% = 1 'Output File flag flags the error handling routine that a File
            ' Error is found on inputing the output not input filename.
OPEN Filename$ + ".DAT" FOR INPUT AS #1 'Gives an error if the file does NOT
CLOSE #1
OutFile% = 0 'Set the flag back
IF FileExists% = 1 THEN 'Ask user whether or not to overwrite
    INPUT "   NOTE: File exists ... overwrite ? (Y or (N)) : ",FO$
    FO$ = UCASE$(FO$) 'Not case sensitive
    IF FO$ <> "Y" THEN GOTO Start
END IF
'If the file does not exist or the user wants to overwite, open the file.
IF RTRIM$(LTRIM$(Filename$))<>"%" THEN OPEN Filename$ + ".DAT" FOR OUTPUT AS
IF RTRIM$(LTRIM$(Filename$))="%" THEN GOTO START
INPUT "Descriptive line of text in output file : ", lstring$
CALL ibfind ("DVM", device%)
initstr$ = "F1R1N3Z0"
CALL ibwrt (device%, initstr$)
ASKN:
    INPUT "# of data points (2^n where n=1,2,3,...) Def 2048, <0 to quit : ", num%
    IF num% < 0 THEN 'Go back to start if user entered a negative number
        CLOSE #1
        GOTO Start
    END IF
    IF num% = 0 THEN num% = 2048
    IF (num% < 1) OR (num% > 2200) THEN GOTO ASKN
ASKGP: 'Enter the y range for plotting during data gathering
    PRINT "Enter the y range for plotting during data gathering : "
    INPUT "    Enter the maximum voltage (Default 2v) : ",Ymaxgp#
    INPUT "    Enter the minimum voltage (Default -2v) : ",Ymingp#
    IF Ymaxgp# = 0# THEN Ymaxgp# = 2# 'Defaults
    IF Ymingp# = 0# THEN Ymingp# = -2#
    IF Ymaxgp# = Ymingp# THEN GOTO ASKGP 'Ymin can't equal Ymax
    IF Ymaxgp#<Ymingp# THEN 'Make sure the order is correct
        Dmy# = Ymingp#
        Ymingp# = Ymaxgp#
        Ymaxgp# = Dmy#
    END IF
    'Find the number of indices per sec, per timer step and per St# sec
    PRINT "Determining timing for data collection - please wait ... ";
    itimer# = 0 'indices per timer step
    ns# = 0 'Initialize ns%, used to find isec%
    nfinal# = 10000# 'used to find isec%
    'Find the number of indices to loop (w/ TIMER) per timer step, itimer#
    Start# = TIMER : WHILE Start# = TIMER : WEND 'Wait for next TIMER change
    Start# = TIMER : NewTime# = TIMER
    WHILE Start# = NewTime# : itimer# = itimer#+1: NewTime# = TIMER: WEND
    'Find the number of indices to loop per second, isec#
    WHILE ns# < nfinal# : ns# = ns# + 1 : WEND 'Loop 10000 times
    Stp# = TIMER: NewTime2# = TIMER
    nf#=0: WHILE NewTime2#=Stp#: nf#=nf# + 1: NewTime2#=TIMER: WEND
    isec# = 10000# / (Stp# - NewTime# - (1 - nf#/itimer#)*(NewTime2# - Stp#))
    'If applicable, calculate the number of indices to loop per St#, idt#
    testnum% = 200%
    'Set up graphics
    SCREEN 2
    VIEW (50,170)-(600,20),,1
    WINDOW (0,Ymingp#)-(testnum%,Ymaxgp#) 'Plot over user defined y limits
    LINE (0,0)-(testnum%,0) 'Draw 0 line
    FOR tic% = 0 TO testnum% STEP INT(testnum%/10) 'Draw 10 x tic marks
        LINE (tic%, -0.1)-(tic%,0.1)
    NEXT tic%
    LOCATE 1,20 'Print message at the top of the screen
    PRINT "Gathering test data, please wait ...";
    LOCATE 23,5 'Print initial (0) and final index
    PRINT STR$(0);
    LOCATE 23, 78-LEN(STR$(testnum%) + " pts")
    PRINT STR$(testnum%) + " pts";
```

```
Start# = TIMER: WHILE TIMER<Start# + 1.0: WEND 'Wait 1 sec
idt# = isec# * St#
'Determine # of indices to loop for overhead of data collection loop
' not including graphics
Start# = TIMER : WHILE Start# = TIMER : WEND 'Wait until TIMER changes
Start# = TIMER
FOR i% = 0 TO (testnum% - 1)
    'Get a dummy data point and convert
    CALL ibrd (device%, vstr$)
    crvstr% = INSTR(vstr$,CHR$(10))
    IF crvstr%=0 THEN crvstr%=LEN(vstr$)+1
    volt!(i%)=VAL(MID$(vstr$,1,crvstr%-1))
    IF Errflag% = 1 THEN
        CLOSE #1
        GOTO START
    END IF
    'Include plotting statement in calculation of overhead
    ' but don't include the wait loop
    PSET(i%,volt!(i%))    '*****
    ns# = 0
NEXT i%
Stp# = TIMER: NewTime# = TIMER
nf#=0: WHILE NewTime#=Stp#: nf#=nf# + 1: NewTime#=TIMER: WEND
iheader# = isec# * (Stp# - Start# + (1#-nf#/itimer#)*(NewTime#-Stp#)) / testnu
FOR i% = 0 TO 2200: Volt!(i%)=0!: darray#(i%)=0#: NEXT i%
SCREEN 0
CLS
PRINT "loops / header = ";iheader#;"    loops / sec = ";isec#
PRINT "loops / sampling time (uncorrected) = ";idt#
IF iheader# > idt# THEN 'If header time is longer than St#, then ERROR
    BEEP 'to catch the user's attention
    PRINT
    PRINT "  ERROR: Header Time longer Than Sampling Time, try again..."
    PRINT "    (NOTE: Deleting ";LTRIM$(RTRIM$(Filename$));".DAT )"
    iwait#=isec# 'Wait 1 seconds for user to see the message
    ns#=0: WHILE ns#<iwait#: ns#=ns#+1: dmytime#=TIMER: WEND
    CLOSE #1
    SHELL "DEL "+LTRIM$(RTRIM$(Filename$))+".DAT"
    GOTO START
ELSE
    idt# = INT(idt# - iheader# + 0.5#) 'round to nearest integer
    PRINT "loops / sampling time (corrected) = ";idt#
    PRINT
END IF
Start# = TIMER: WHILE TIMER < Start# + 1: WEND 'Wait 1 second
'Get ready to take data
PRINT
INPUT "Please press RETURN when ready to TAKE DATA : ",Dmy$
'Set up graphics
CLS
SCREEN 2
VIEW (50,170)-(600,20),,1
WINDOW (0,Ymingp#)-(num%,Ymaxgp#) 'Plot over user defined limits
LINE (0,0)-(num%,0)
FOR tic% = 0 TO num% STEP INT(num%/10)
    LINE (tic%, -0.1)-(tic%,0.1)
NEXT tic%
LOCATE 1,25
PRINT "Gathering data, please wait ...";
LOCATE 23,5
PRINT STR$(0);
LOCATE 23, 78-LEN(STR$(num%) + " pts")
PRINT STR$(num%) + " pts";
LOCATE 24, 78-LEN(STR$(INT(num% * St# *1000)/1000)+" sec")
PRINT STR$(INT(num% * St# *1000)/1000)+" sec";
Start# = TIMER: WHILE TIMER<Start# + 1.5: WEND 'Wait 1.5 sec
Start# = TIMER
'We are starting data collection on a TIMER step
```

```
   FOR i% = 0 TO (num%-1)
      'Get data point and convert
10    CALL ibrd (device%, vstr$)
20    crvstr% = INSTR(vstr$,CHR$(10))
30    IF crvstr%=0 THEN crvstr%=LEN(vstr$)+1
40    volt!(i%)=VAL(MID$(vstr$,1,crvstr%-1))
50    IF Errflag% = 1 THEN
60       CLOSE #1
70       GOTO START
80    END IF
90    PSET(i%,volt!(i%)) 'Plot data point
      'Wait loop is determined by looping through a WHILE statement
      ' a fixed number of times, thus the jitter is limited to that
      ' produced by the HP multimeter.
100   ns# = 0: WHILE ns# < idt#: ns# = ns# + 1: WEND
   NEXT i%
   Finish# = TIMER: NewTime# = TIMER
   nf# = 0: WHILE Finish# = NewTime#: nf#=nf#+1: NewTime# = TIMER: WEND
   Finish# = TIMER
   freq! = num%/(Finish# - (itimer# - nf#)/isec# - Start#)
   PRINT #1, "Digital Voltmeter Sampling Rate = "; freq!
   PRINT #1, 1string$
   FOR i% = 0 TO (num% - 1): PRINT #1, volt!(i%): Next i%
   FOR i% = 0 TO 2200: x#(i%) = i% / freq!: NEXT i%
   SCREEN 0
   CLS
END IF
II 'Graph data
   CALL GrfReset(4)
   CALL SetTitle("Time Domain - " + Filename$)
   CALL SetAxAuto(-1, 2)
   CALL SetXDataType(4)
   CALL SetYDataType(3)
   CALL GrfCurv2D(x#(), volt!(), num%)

III ASK: CALL SetDisplayMode(0)
   SHELL "CLS"
   PRINT "FILE: ", Filename$
   PRINT
   PRINT "Display Fast Hartley Transform (FHT) of data (F),"
   PRINT " (Options: low-pass filter data using Butterworth filter"
   PRINT "             high-pass filter data using Butterworth filter)"
   PRINT "Display Power Spectrum of data (S),"
   PRINT " (Options: derive signal frequency from Power Spectrum of data)"
   PRINT "Remove mean from data (M),"
   PRINT "Ignore all but a window of data (W),"
   PRINT "Remove linear envelope from data (V),"
   PRINT "Average data over n points (A),"
   PRINT "Subtract baseline (B),"
   PRINT "Show change in frequency (T),"
   PRINT "Get frequency manually (G),"
   PRINT "Display data (D),"
   PRINT "Input new data (N),"
   INPUT "or End (E) : ", O$
   O$ = UCASE$(O$) 'Not case sensitive
   IF O$ = "F" THEN fhtdata freq!, num%, Filename$
   IF O$ = "S" THEN psdata freq!, num%, Filename$
   IF O$ = "M" THEN meandata freq!, num%, Filename$
   IF O$ = "W" THEN zerodata freq!, num%, Filename$
   IF O$ = "A" THEN signave freq!, num%, Filename$
   IF O$ = "B" THEN basesubtr freq!, num%, Filename$
   IF O$ = "T" THEN freqvst freq!, num%, Filename$
   IF O$ = "G" THEN getfreq freq!, num%, Filename$
   IF O$ = "D" THEN display freq!, num%, Filename$
   IF O$ = "N" THEN
      CLOSE #1
      GOTO START
```

```
END IF
IF O$ = "E" THEN
    CLOSE #1
    GOTO ENDL
END IF
GOTO ASK
ErrHandling: 'The type of error is determined by the ERR code.
' Note: When I tried to compile this program in a version which made use of
' the RESUME or RESUME NEXT statements, I kept getting 'Out of Memory' errors.
IF Outfile%<>1 AND ERR<>62 THEN BEEP 'Beep to catch the user's attention
SELECT CASE ERR
    CASE 6,57 'Assume that these errors only happen on data gathering
        CALL SetDisplayMode(0)
        CLS
        Errflag% = 1 'Set data gathering error flag
        IF ERR = 6 THEN PRINT "ERROR : Overflow occurred ."
        IF ERR = 57 THEN PRINT "ERROR : Device I/O error occurred ."
        PRINT " ERL = ";ERL 'Print source code line number of error
        PRINT " vstr$ = *";vstr$;"*"
        PRINT " crvstr% = ";crvstr%
        PRINT " volt!(";i%;") = ";volt!(i%)
        INPUT " Press RETURN when ready : ",Dmy$
        RESUME NEXT
    CASE 52,64,53,54 'Filename errors
        IF OutFile% = 0 THEN 'If error occurred on input filename
            PRINT
            IF ERR = 52 THEN PRINT "ERROR : Bad File Name or Number ... Try again ."
            IF ERR = 64 THEN PRINT "ERROR : Bad File Name ... Try again ..."
            IF ERR = 53 THEN PRINT "ERROR : File Not Found ... Try again ..."
            IF ERR = 54 THEN PRINT "ERROR : Bad File Mode ... Try again ..."
            Errflag% = 1
            RESUME NEXT
        ELSE 'If error occurred on output filename
            FileExists% = 0
            RESUME NEXT
        END IF
    CASE 58 'FILE ALREADY EXISTS - assumed to happen only on entering output file
        RESUME NEXT 'The default of FileExists% is that the file already exists.
    CASE 7 'OUT OF MEMORY - assume this is a lack of work area for LW functions
        'NOTE: Grabbing 10000 bytes more of memory and RESUMEing the LW function
        ' on a memory error may have resulted in a corruption of string memory
        ' space ... the program then runs erratically. In other words, this
        ' method may cause trouble ... it might be better just to give a
        ' memory error message and exit the program. This section was originally
        ' added to overcome baseline subtraction memory limits. ... B.A.N.
        Meminc% = Meminc% + 1 'Counts the number of times memory is added
        IF Meminc% > 5  THEN 'Don't try to add more memory > 5  times
            CALL SetDisplayMode(0)
            CLS
            PRINT "ERROR : Out Of Memory (Tried adding 10000 bytes of memory"
            PRINT "            using getmem(10000&) more than 5 times.)"
            GOTO Endl
        ELSE
            CALL getmem(10000&) 'Try to get more work area
            RESUME
        END IF
    CASE 62 'INPUT PAST END OF FILE - assumed to occur on reading input files
        Errflag% = 1
        RESUME NEXT
    CASE ELSE
        'If an unanticipated error has occurred, display the message for that
        'error and stop the program.
        CALL SetDisplayMode(0)
        CLS
        PRINT
        PRINT "Unexpected ERROR : "
        PRINT " ERROR CODE ";ERR;" at LINE ";ERL
        PRINT
```

```
            GOTO Endl  'End Program
END SELECT

ENDL: END

'basesubtr - calculates the baseline trend by fitting a fifth order polynomial
'  V         to the data (plotted in red) and subtracts the baseline trend
SUB basesubtr (freq!, num%, Filename$)
    CALL Clear1D(darray#(), 2200)
    CALL GrfReset (4)
    CALL SetAxAuto(-1, 2)
    FOR i% = 0 TO 2200: x#(i%) = i% / freq!: NEXT i%
    CALL SetTitle("Time Domain - " + Filename$)
    CALL SetXDataType(4)
    CALL SetYDataType(3)
    CALL GrfCurv2D(x#(), volt!(), num%)
    FOR i% = 0 TO num%: darray#(i%) = volt!(i%): NEXT i%
V111
    CALL PolyFit(x#(), darray#(), num%, 5, darray#(), cceff#(), mse#)
    IF dsperr% = 0 THEN
        CALL SetYDataType(4)
        CALL SetCrvColor(4)
        CALL GrfCurv2D(x#(), darray#(), num%)
        FOR i% = 0 TO num%: volt!(i%) = volt!(i%) - darray#(i%): NEXT i%
    ELSE
        CALL SetDisplayMode(0)
        SHELL "CLS"
        PRINT "Polynomial Fit Error (dsperr%) = ", dsperr%
    END IF
    CALL GrfReset(4)
    CALL SetCrvColor(15)
    CALL SetYDataType(3)
    CALL GrfCurv2D(x#(), volt!(), num%)
    FOR i% = 0 TO 2200: darray#(i%) = 0#: NEXT i%
END SUB 'display - displays a window of the data (Default, displays all data)
SUB display (freq!, num%, Filename$)
    CALL SetDisplayMode(0)
    SHELL "CLS"
    INPUT " Lower time limit to display (Default 0): ", l!
    INPUT " Upper time limit to display (Default tmax): ", u!
    IF u! = 0! THEN u! = num% / freq!
    CALL SetAxAuto(0, 0)
    CALL SetAxRange(0, l!, u!, 10)
    CALL GrfReset(4)
    FOR i% = 0 TO 2200: x#(i%) = i% / freq!: NEXT i%
    CALL SetTitle("Time Domain - " + Filename$)
    CALL SetXDataType(4)
    CALL SetYDataType(3)
    CALL GrfCurv2D(x#(), volt!(), num%)
    PRINT "grferr = ", grferr
END SUB
 VII
'fhtdata - displays the fast hartley transform of the data and, if the user
'          requests these options, it does High and/or Low Pass Butterworth
'          filtering of the data.
SUB fhtdata (freq!, num%, Filename$)
    CALL SetDisplayMode(0)
    SHELL "CLS"
    LP% = 0: HP% = 0
ASKLP: INPUT "Low-pass Butterworth filter the data (Y or (N)) : ", O$
    IF (O$ = "Y") OR (O$ = "y") THEN LP% = 1
ASKHP: INPUT "High-pass Butterworth filter the data (Y or (N)) : ", O$
    IF (O$ = "Y") OR (O$ = "y") THEN HP% = 1
    INPUT "# data points for Power Spectrum (2^n, Default 2048) ? ", indstr$
    IF VAL(indstr$) = 0 THEN
        ind% = 2048
```

```
    ELSE
        ind% = VAL(indstr$)
    END IF
    n% = LOG(ind%) / LOG(2!): ind% = 2! ^ n%
    FOR i% = 0 TO (num% - 1): darray#(i%) = volt!(i%): NEXT i%
    CALL FHT(darray#(), ind%)
    CALL GrfReset(4)
    CALL SetAxAuto(0, 0)
    INPUT "Lower frequency limit to display (Default 0 Hz) :", il!
ASKUF: INPUT "Upper frequency limit to display (Default 3 Hz): ", iu!
    IF iu! = 0! THEN iu! = 3!
    IF iu! < il! THEN GOTO ASKUF
    CALL SetAxRange(0, il!, iu!, 10)
    FOR i% = 0 TO 2200: x#(i%) = i% * freq! / ind%: NEXT i%
    CALL SetTitle("Frequency Domain - " + Filename$)
    CALL SetXDataType(4)
    CALL SetYDataType(4)
    CALL GrfCurv2D(x#(), darray#(), FIX(iu! * ind% / freq!))
    CALL InvFHT(darray#(), ind%)
    CALL GrfReset(4)
    CALL SetAxAuto(-1, 2)
    FOR i% = 0 TO 2200: x#(i%) = i% / freq!: NEXT i%
    CALL SetTitle("Time Domain - " + Filename$)
    CALL SetXDataType(4)
    CALL SetYDataType(4)
    CALL GrfCurv2D(x#(), darray#(), num%)
    IF LP% = 1 THEN
        CALL SetDisplayMode(0)
        SHELL "CLS"
        INPUT "Upper Cutoff Frequency for Low-pass Butterworth Filter : "; iu#
        samplrate# = 1 / freq!
        CALL Bw.LPF(darray#(), num%, iu#, samplrate#, 5, darray#())
        CALL GrfReset(4)
        CALL SetXDataType(4)
        CALL SetYDataType(4)
        CALL GrfCurv2D(x#(), darray#(), num%)
    END IF
    IF HP% = 1 THEN
        CALL SetDisplayMode(0)
        SHELL "CLS"
        INPUT "Lower Cutoff Frequency for High-pass Butterworth Filter : "; il#
        samplrate# = 1 / freq!
        CALL Bw.HPF(darray#(), num%, il#, samplrate#, 5, darray#())
        CALL GrfReset(4)
        CALL SetXDataType(4)
        CALL SetYDataType(4)
        CALL GrfCurv2D(x#(), darray#(), num%)
    END IF
    FOR i% = 0 TO (num% - 1): volt!(i%) = darray#(i%): NEXT i%
    CALL Clear1D(darray#(), 3000)
END SUB 'getfreq - lets the user use two cursors to define a wave from the data
'          for which the waves frequency is displayed.
SUB getfreq (freq!, num%, Filename$)
    CALL SetDisplayMode(0)
    SHELL "CLS"
    INPUT " Lower time limit to display (Default 0): ", l!
    INPUT " Upper time limit to display (Default tmax): ", u!
    IF u! = 0! THEN u! = num% / freq!
    lower% = l! * freq! + 1: upper% = u! * freq! - 1
    CALL GrfReset(4)
    p1% = CreatePort(0, 0, 100, 100)
    CALL SetAxAuto(-1, 0)
    CALL SetAxRange(0, l!, u!, 10)
    max# = -9999999#: min# = 9999999#
    FOR i% = lower% TO upper%
        IF volt!(i%) > max# THEN max# = volt!(i%)
```

```
            IF volt!(i%) < min# THEN min# = volt!(i%)
        NEXT i%
        drange# = max# - min#
        max# = max# + drange# / 5#
        min# = min# - drange# / 10#
        CALL SetAxRange(1, min#, max#, 10)
        CALL SetCurv2D (1)
        CALL SetCrvColor (15)
        CALL SetPlotMode (0)
        CALL SetPointStyle (4)
        FOR i% = 0 TO 2200: x#(i%) = i% / freq!: NEXT i%
        CALL SetTitle("Time Domain - " + Filename$)
        CALL SetXDataType (4)
        CALL SetYDataType (3)
        CALL GrfCurv2D (x#(), volt!(), num%)
        xtxt# = 1! + (u! - 1!) / 30#: ytxt# = max# - drange# / 20#
        cmndstr$ = "F1-Select Left Cursor, F2-Select Right Cursor, F10-Exit"
        CALL GrfText2D (xtxt#, ytxt#, cmndstr$)
        ytxt# = ytxt# - drange# / 20#
        cmndstr$ = "Move: Slow-left + right arrow keys, Fast-Page Up, Page Down"
        CALL GrfText2D (xtxt#, ytxt#, cmndstr$)
        CALL SaveGraphFile ("RHEEDGrf.TMP", p1%)
        lc% = lower%: rc% = upper%: slc% = 1: src% = 0
        oldlc% = lc%: oldrc% = rc%: numptsgrf% = 0
pp:
    'This section clears graphics memory when it gets low *
        IF (numptsgrf% > 300) THEN
            numptsgrf% = 0
            CALL GrfReset(4) 'Clears Graphics Memory
            dummy% = LoadGraphFile ("RHEEDGrf.TMP", p1%)
            CALL DisplayPort (p1%)
        END IF
        CALL SetCrvColor (15)
        IF slc% = 1 THEN
            xpt# = x#(oldlc%)
            CALL GrfPoint2D (xpt#, volt!(oldlc%))
        ELSE
            xpt# = x#(oldrc%)
            CALL GrfPoint2D (xpt#, volt!(oldrc%))
        END IF
        CALL SetCrvColor (3)
        CALL GrfPoint2D (x#(lc%), volt!(lc%))
        CALL SetCrvColor (4)
        CALL GrfPoint2D (x#(rc%), volt!(rc%))
        numptsgrf% = numptsgrf% + 3
    'Display Current Frequency
        IF rc% <> lc% THEN
            Gf! = INT((freq! / (rc% - lc%))*10000)/10000! 'Round to nearest 0.0001Hz
            ferror% = 100 / (rc% - lc%)
            freqstr$ = "freq(Hz)=" + STR$(Gf!) + " +/- " + STR$(ferror%) + "%"
            lcstr$ = "   time_1(s)=" + STR$(INT(x#(lc%) * 10)/10)
            rcstr$ = "   time_2(s)=" + STR$(INT(x#(rc%) * 10)/10)
            messagestr$ = freqstr$ + lcstr$ + rcstr$
        ELSE
            messagestr$ = "*ERROR** left cursor = right cursor *"
        END IF
        CALL GrfMsg (messagestr$, 15)
        k$ = ""
        WHILE LEN(k$) <> 2
            k$ = INKEY$
        WEND
        code% = ASC(RIGHT$(k$, 1))
        oldlc% = lc%: oldrc% = rc%
        SELECT CASE code%
            CASE RIGHT.ARROW%
                IF (slc% = 1) AND (lc% < upper%) THEN lc% = lc% + 1
                IF (src% = 1) AND (rc% < upper%) THEN rc% = rc% + 1
```

```
            CASE LEFT.ARROW%
                IF (slc% = 1) AND (lc% > lower%) THEN lc% = lc% - 1
                IF (src% = 1) AND (rc% > lower%) THEN rc% = rc% - 1
            CASE F1%
                slc% = 1: src% = 0
            CASE F2%
                slc% = 0: src% = 1
            CASE F10%
                GOTO endgfreq
            CASE HOME%
                IF slc% = 1 THEN lc% = lower%
                IF src% = 1 THEN rc% = lower%
            CASE ENDKEY%
                IF slc% = 1 THEN lc% = upper%
                IF src% = 1 THEN rc% = upper%
            CASE PGUP%
                IF slc% = 1 THEN
                    lc% = lc% + 50
                    IF lc% > upper% THEN lc% = upper%
                ELSE
                    rc% = rc% + 50
                    IF rc% > upper% THEN rc% = upper%
                END IF
            CASE PGDN%
                IF slc% = 1 THEN
                    lc% = lc% - 50
                    IF lc% < lower% THEN lc% = lower%
                ELSE
                    rc% = rc% - 50
                    IF rc% < lower% THEN rc% = lower%
                END IF
        END SELECT
        GOTO pp
endgfreq:
    CALL SetPlotMode (2)
    CALL SetCurv2D (0)
    CALL SetCrvColor (15)
    CALL SetDisplayMode(0)
    CALL SetAxAuto (-1, 2)
    SHELL "DEL RHEEDGrf.TMP"
    CLS
END SUB 'freqvst - gives a plot of wave frequency as a function of time by finding
'          up to 75 minima of the data and plotting the frequency of the
'          waves defined by the minima. The first minimum stored is the
'          one that occurs after the first maximum (see code).
SUB freqvst (freq!, num%, Filename$)
    CALL SetDisplayMode(0)
    SHELL "CLS"
    'An upper limit for output frequency must be chosen so that an attempt
    ' can be made at ignoring noise of higher frequency.
ASKFU: INPUT "Upper limit for output frequency (Default 3 Hz): ", fu!
    IF fu! < 0 THEN GOTO ASKFU
    IF fu! = 0! THEN fu! = 3
    fupper% = FIX(fu! * 2048 / freq!)
    smax% = 1: smin% = 0: maxv! = -999.9: minv! = 999.9: nmin% = 0
    LOCATE 3, 3
    FOR i% = 0 TO (num% - 1)
        IF nmin% >= 75 THEN GOTO ENDFVST
        IF smax% = 1 THEN 'If we are currently looking for a maximum
            IF volt!(i%) > maxv! THEN
                maxv! = volt!(i%): imax% = i%
            END IF
            'If we have passed a maximum, then start looking for a minimum
            ' (freq!/fu!)/2.2 (slightly < half the number of points per maximum
            ' frequency) is picked as the determining distance away from the
```

```
                 last maximum at which to switch. This is an attempt at trying
               ' to get a reasonable freq vs time curve from noisy data.
               IF i% > (imax% + (freq!/fu!)/2.2) THEN
                   minv! = 999.9: maxv! = -999.9
                   smax% = 0: smin% = 1
               END IF
           ELSE 'If we are currently looking for a minimum
               IF volt!(i%) < minv! THEN
                   minv! = volt!(i%): imin% = i%
               END IF
               'If we have passed a minimum, then start looking for a maximum
               ' (freq!/fu!)/2.2 (slightly < half the number of points per maximum
               ' frequency) is picked as the determining distance away from the
               ' last minimum at which to switch. This is an attempt at trying
               ' to get a reasonable freq vs time curve from noisy data.
               IF i% > (imin% + (freq!/fu!)/2.2) THEN
                   nmin% = nmin% + 1: minindex%(nmin%) = imin%
                   maxv! = -999.9: minv! = 999.9
                   smax% = 1: smin% = 0
               END IF
           END IF
       NEXT i%
ENDFVST: CLS
       LOCATE 3, 3
       FOR i% = 1 TO (nmin% - 1)
           IF minindex%(i%) <> minindex%(i% + 1) THEN
               fr#(i% - 1) = freq! / (minindex%(i% + 1) - minindex%(i%))
               x#(i% - 1) = (minindex%(i%) + minindex%(i% + 1)) / 2# / freq!
           END IF
       NEXT i%
       'Plot the frequency as a function of time
       CALL Clear1D(darray#(), 2200)
       CALL GrfReset(4)
       CALL SetAxAuto(-1, 2)
       CALL SetTitle("Time Domain - " + Filename$)
       CALL SetXDataType(4)
       CALL SetYDataType(4)
       CALL GrfCurv2D(x#(), fr#(), nmin% - 1)
       'Plot the fifth order polynomial fit in red
       CALL PolyFit (x#(), fr#(), nmin% - 1, 5, fr#(), coeff#(), mse#)
       CALL SetCrvColor (4)
       CALL GrfCurv2D (x#(), fr#(), nmin% - 1)
       CALL SetCrvColor (15)
END SUB 'meandata - subtracts the average value from the data (for data that has a
'IV         constant DC offset)
SUB meandata (freq!, num%, Filename$)
    sum# = 0#: FOR i% = 0 TO (num% - 1): sum# = sum# + volt!(i%): NEXT i%
    ave! = sum# / num%
    FOR i% = 0 TO (num% - 1): volt!(i%) = volt!(i%) - ave!: NEXT i%
    CALL GrfReset(4)
    CALL SetAxAuto(-1, 2)
    FOR i% = 0 TO 2200: x#(i%) = i% / freq!: NEXT i%
    CALL SetTitle("Time Domain - " + Filename$)
    CALL SetXDataType(4)
    CALL SetYDataType(3)
    CALL GrfCurv2D(x#(), volt!(), num%)
END SUB
   IX
'psdata - does a power spectrum of the data and finds the peak freq
' a centroid finding algorithm
SUB psdata (freq!, num%, Filename$)
    DIM YN AS STRING*1
    CALL SetDisplayMode(u)
    SHELL "CLS"
    FOR i% = 0 TO (num% - 1): darray#(i%) = volt!(i%): NEXT i%
    INPUT "# data points for Power Spectrum (2^n, Default and max 2048) ? ",indst
```

```
        IF VAL(indstr$) = 0 THEN
            ind% = 2048
        ELSE
            ind% = VAL(indstr$)
        END IF
        IF ind% > 2048 THEN ind% = 2048
        n% = LOG(ind%) / LOG(2!): ind% = 2! ^ n%
        CALL Spectrum(darray#(), ind%)
        fllim! = 0!: fulim! = 3!
PlotSpectrum:
        PRINT "Lower frequency limit to display (Default "; fllim!;
        INPUT " Hz): ", ilstr$
        il! = VAL(ilstr$)
        PRINT "Upper frequency limit to display (Default "; fulim!;
        INPUT " Hz): ", iu!
        IF (il! = 0) AND (INSTR(ilstr$, "0") = 0) THEN il! = fllim!
        IF iu! = 0 THEN iu! = fulim!
        fllim! = il!: fulim! = iu!
        lower% = il! * ind% / freq!: upper% = iu! * ind% / freq!
        IF lower% < 0 THEN lower% = 0 'Frequency can't be negative
        IF upper% > ind% / 2 THEN upper% = ind% / 2 'Not more than max freq
        INPUT "Percent of maximum Spectrum height to display (Default 120): "; sp%
        IF (sp% <= 0) THEN sp% = 120
        max# = -999999#
        FOR i% = lower% TO upper%
            IF (darray#(i%) > max#) THEN
                max# = darray#(i%)
                imax% = i%
            END IF
        NEXT i%
        CALL GrfReset(4)
        CALL SetAxAuto(-1, 0)
        CALL SetAxRange(1, 0, max# * sp% / 100#, 10)
        CALL SetAxRange(0, il!, iu!, 10)
        FOR i% = 0 TO 2200: x#(i%) = i% * freq! / ind%: NEXT i%
        CALL SetTitle("Frequency Domain - " + Filename$)
        CALL SetXDataType(4)
        CALL SetYDataType(4)
        CALL GrfCurv2D(x#(), darray#(), FIX(iu! * ind% / freq!))
        CALL SetDisplayMode(0)
        SHELL "CLS"
AskReplot: INPUT "Replot with new limits (Y or (N)): "; YN$
        YN$ = UCASE$(YN$) 'Not case sensitive
        IF YN$ = "Y" THEN GOTO PlotSpectrum
        IF imax% > 1 THEN
            numf# = 0!
            denomf# = 0!
            FOR ipeak% = imax% - 2 TO imax% + 2
                numf# = numf# + (SQR(darray#(ipeak%)) * ipeak%)
                denomf# = denomf# + SQR(darray#(ipeak%))
            NEXT ipeak%
            f# = numf# / denomf#
            PRINT "Signal Frequency (Hz) = ", f# * freq! / ind%
        ELSE
            PRINT "Error: Power Spectrum peak occurs at around 0 Hz."
        END IF
        PRINT
        INPUT "Press RETURN when ready to continue : ", dummy$
        CALL Clear1D(darray#(), 3000)
        CALL SetAxAuto(-1, 2)
END SUB 'signave - performs a running average over the data for a given # of points
SUB signave (freq!, num%, Filename$)
    CALL SetDisplayMode(0)
    SHELL "CLS"
    INPUT " Moving average over how many points (Odd number) - Default 1: ", n%
    IF n% < 1 THEN n% = 1
```

```
           IF n% / 2! = FIX(n% / 2!) THEN n% = n% + 1
           FOR i% = FIX(n% / 2!) TO (num% - 1 - FIX(n% / 2!))
               sum# = 0!
               FOR j% = FIX(-1! * n% / 2!) TO FIX(n% / 2!): sum# = sum# + volt!(i% + j%)
               volt!(i% - FIX(n% / 2!)) = sum# / n%
           NEXT i%
           sum# = 0#: FOR i% = 0 TO (num% - n% - 1): sum# = sum# + volt!(i%): NEXT i%
           FOR i% = 0 TO (num% - 2 - n%): volt!(i%) = volt!(i%) - (sum# / (num% - n%)):
           FOR i% = (num% - 1 - n%) TO (num% - 1): volt!(i%) = 0!: NEXT i%
           num% = num% - n%
           CALL GrfReset(4)
           CALL SetAxAuto(-1, 2)
           FOR i% = 0 TO 2200: x#(i%) = i% / freq!: NEXT i%
           CALL SetTitle("Time Domain - " + Filename$)
           CALL SetXDataType(4)
           CALL SetYDataType(3)
           CALL GrfCurv2D(x#(), volt!(), num%)
       END SUB
         VI
        'zerodata - lets the user chose a window of data to keep, sets the rest
        '           of the data to zero, and shifts the window of data to the front
        '           of the working array
       SUB zerodata (freq!, num%, Filename$)
           CALL SetDisplayMode(0)
           SHELL "CLS"
           INPUT " Enter lower time limit of window (Default 0) : ", tl!
           INPUT " Enter upper time limit of window (Default tmax) : ", tu!
           IF tu! = 0! THEN tu! = (num% - 1) / freq!
           tl! = tl! * freq!
           tu! = tu! * freq!
           num% = FIX(tu! - tl!)
           FOR i% = FIX(tl!) TO FIX(tu!): darray(i% - FIX(tl!)) = volt!(i%): NEXT i%
           FOR i% = 1 TO 2200: volt!(i%) = 0!: NEXT i%
           FOR i% = 0 TO num%: volt!(i%) = darray#(i%): NEXT i%
           FOR i% = 0 TO 2200: darray#(i%) = 0#: NEXT i%
           CALL GrfReset(4)
           CALL SetAxAuto(-1, 2)
           FOR i% = 0 TO 2200: x#(i%) = i% / freq!: NEXT i%
           CALL SetTitle("Time Domain - " + Filename$)
           CALL SetXDataType(4)
           CALL SetYDataType(3)
           CALL GrfCurv2D(x#(), volt!(), num%)
       END SUB
```

We claim:

1. A method of controlling the growth of a layer of material as it is being grown, comprising the steps of:
   subjecting the growing layer to a beam of energy;
   b) collecting time varying data of the oscillatory variations induced in said beam during the growth process;
   c) converting said time varying data to frequency varying data;
   d) utilizing said frequency varying data to control said growth process.

2. A method of analyzing the growth of a layer of material as it is being grown, comprising the steps of:
   a) directing a beam of energy onto the growing layer;
   b) generating a time varying beam pattern of the variations in the beam induced by said growth;
   c) generating a frequency varying beam pattern corresponding to said time varying beam pattern.

3. The method of claim 1 wherein the beam of energy is taken from the group comprising electron, photon or X-ray energy.

4. The method of claim 1 wherein the collected data relates to data from the group comprising scattered, diffracted, reflected or transmitted beam variations.

5. The method of claim 1 wherein the collected data is sampled and processed to determine the mean of the data and baseline corrected to compensate for signal drift and filtered to remove undesirable noise components.

6. The method of claim 5 wherein the data processed in claim 5 is converted by squaring the Fourier transform of the data as normalized by the number of data points sampled and the centroid of the resultant data curve determined.

7. The method of claim 1 wherein the data comprises only one cycle of oscillation corresponding to one growth layer.

8. The method of claim 2 wherein the beam of energy is taken from the group comprising electron, photon or X-ray energy.

9. The method of claim 2 wherein the collected data relates to data from the group comprising scattered, diffracted, reflected or transmitted beam variations.

10. The method of claim 2 wherein the collected data is sampled and processed to determine the mean of the data and baseline corrected to compensate for signal drift and filtered to remove undesirable noise components.

11. The method of claim 10 wherein the data processed in claim 5 is converted by squaring the Fourier transform of the data as normalized by the number of data points sampled and the centroid of the resultant data curve determined.

12. The method of claim 2 wherein the data comprises only one cycle of oscillation corresponding to one growth layer.

13. Apparatus for controlling the growth of a layer of material during the growth process, comprising:
  a) an energy source for subjecting the growing layer to a beam of energy;
  b) apparatus for detecting variations in said energy beam caused by the growth process and generating a time-varying pattern in response thereto;
  c) apparatus for processing said time varying pattern to produce a frequency varying pattern corresponding thereto.

14. Apparatus for analyzing the growth of a layer of material during growth, comprising:
  b) apparatus for directing a beam of energy at the growth layer;
  b) apparatus for generating a time varying beam pattern of the variations in the beam induced by said growth; and
  c) apparatus for generating a frequency varying beam pattern corresponding to said time varying beam pattern.

15. A method of controlling the growth of a layer of semiconductor material as it is being grown, comprising the steps of:
  a) subjecting the growing layer to a beam of electron energy to obtain a diffraction pattern;
  b) detecting time varying data of intensity oscillatory variations induced in said beam of the diffraction pattern during the growth process;
  converting said time varying data to frequency varying data corresponding to said time varying data; and
  d) utilizing said frequency varying data to control said growth process.

16. A method of analyzing the growth of a layer of semiconductor material as it is being grown, comprising the steps of:
  a) directing a beam of electron energy onto the growing semiconductor layer;
  b) detecting a time varying diffraction beam pattern of the variations in the electron beam induced by said growth; and
  c) generating a frequency varying beam pattern corresponding to said time varying beam pattern.

17. Apparatus for controlling the growth of a layer of semiconductor material during the growth process, comprising:
  a) an energy source for subjecting the growing layer to a beam of electron energy to produce a diffraction pattern;
  b) apparatus for detecting variations in said electron energy beam caused by the growth process and generating a time-varying pattern in response thereto;
  c) apparatus for processing said time varying pattern to produce a frequency varying pattern corresponding thereto.

18. A method of analyzing the growth of a layer of semiconductor material as it is being grown, comprising the steps of:
  a) subjecting the growing layer to a beam of electron energy to obtain a diffraction pattern;
  b) detecting time varying data of intensity oscillatory variations induced in said beam of the diffraction pattern during the growth process;
  c) converting said time varying data to frequency varying data corresponding to said time varying data by
    (i) determining the mean of the varying data;
    (ii) determining the baseline trend of the mean of the time varying data by fitting a polynomial to the data and subtracting the baseline from the data;
    (iii) processing the baseline time varying data by taking a Fourier transform of the baseline time varying data to generate said frequency varying data; and
    (iv) determining the centroid of such frequency varying data.

19. Apparatus for controlling the growth of a layer of semiconductor material during the growth process, comprising:
  a) an energy source for subjecting the growing layer to a beam of electron energy to produce a diffraction pattern;
  b) apparatus for detecting variations in said electron energy beam caused by the growth process and generating a time-varying digitized voltage pattern in response thereto;
  c) apparatus for processing said time varying pattern to produce a frequency varying pattern corresponding thereto comprising:
    (i) apparatus for determining the mean of the time varying data;
    (ii) apparatus for determining the baseline trend of the time varying data by fitting a polynomial to the data and subtracting the baseline from the mean of the data; and
    (iii) apparatus for processing the baseline of the time varying data by performing a Fourier transform of the baseline of the time varying data to generate said frequency varying data; and
    (iv) apparatus for determining the centroid of such frequency varying data.

20. The apparatus of claim 19 wherein the data comprises only one cycle of oscillating corresponding to one growth layer.

* * * * *

UNITED STATES PATENT AND TRADEMARK OFFICE
CERTIFICATE OF CORRECTION

PATENT NO. : 5,122,222

DATED : June 16, 1992

INVENTOR(S) : George W. Turner, Bettina A. Nechay and Stephen J. Eglash

It is certified that error appears in the above-identified patent and that said Letters Patent is hereby corrected as shown below:

Claim 1, col. 33, line 48, before "subjecting" insert ---a)---.

Claim 11, col. 35, line 2, delete "5" and insert ---10---.

Claim 18, col. 36, line 18, before "varying" insert ---time---.

Claim 20, col. 36, line 54, delete "oscillating" and insert ---oscillation---.

Signed and Sealed this

Thirty-first Day of August, 1993

Attest:

BRUCE LEHMAN

Attesting Officer  Commissioner of Patents and Trademarks